(12) United States Patent
Yamaguchi et al.

(10) Patent No.: US 6,362,031 B1
(45) Date of Patent: Mar. 26, 2002

(54) SEMICONDUCTOR TFT, PRODUCING METHOD THEREOF, SEMICONDUCTOR TFT ARRAY SUBSTRATE AND LIQUID CRYSTAL DISPLAY USING THE SAME

(75) Inventors: Takehisa Yamaguchi; Akio Nakayama, both of Nishigoshi-machi (JP)

(73) Assignee: Advanced Display Inc., Kikuchi-gun (JP)

( * ) Notice: Subject to any disclaimer, the term of this patent is extended or adjusted under 35 U.S.C. 154(b) by 0 days.

(21) Appl. No.: 09/448,946

(22) Filed: Nov. 24, 1999

Related U.S. Application Data

(62) Division of application No. 09/013,938, filed on Jan. 27, 1998.

(30) Foreign Application Priority Data

Jan. 27, 1997 (JP) ............................... 9-12823
Mar. 27, 1997 (JP) ............................... 9-76309

(51) Int. Cl.⁷ ............................................. H01L 21/84
(52) U.S. Cl. ....................... 438/158; 438/203; 438/303; 438/304
(58) Field of Search ................................. 438/158, 203, 438/303, 304, 305, 306, 299, 479; 257/66, 59, 395, 325, 332

(56) References Cited

U.S. PATENT DOCUMENTS 5,164,806 A * 11/1992 Nagatomo et al. .......... 257/395
5,300,804 A * 4/1994 Arai ............................ 257/332
5,600,154 A * 2/1997 Shimizu et al. ............... 257/66
5,614,728 A * 3/1997 Akiyama ....................... 257/57
5,789,778 A * 8/1998 Murai ......................... 257/325
5,834,352 A * 11/1998 Choi ........................... 438/275
5,874,329 A * 2/1999 Neary et al. ................. 438/203
6,017,781 A * 1/2000 Shimizu et al. ............. 438/158
6,066,535 A * 5/2000 Murai ......................... 438/303
6,188,058 B1 * 2/2001 Shimizu et al. ............... 257/66
6,198,140 B1 * 3/2001 Muramoto et al. .......... 257/392
6,225,644 B1 * 5/2001 Yamaguchi et al. ........... 257/59

FOREIGN PATENT DOCUMENTS

JP    403204940    *  9/1991  .................. 21/336
JP    4082744193   * 10/1996
JP    411340242    * 12/1999  .................. 21/331

* cited by examiner

Primary Examiner—Charles Bowers
Assistant Examiner—Laura Schillinger
(74) Attorney, Agent, or Firm—Oblon, Spivak, McClelland, Maier & Neustadt, P.C.

(57) ABSTRACT

A TFT of the present invention includes an insulating substrate, a first conductive film layer which is to be a gate electrode provided on the insulating substrate, a first insulating film layer which is to be a gate insulating film layer provided on the first conductive film layer, a non-doped semiconductor layer formed on the first insulating film layer, and a second conductive film layer which is to be a source electrode formed on a source region of the semiconductor layer and a drain electrode formed on a drain region of the semiconductor, wherein a junction is formed by implanting an n-type impurity in the source region of the semiconductor layer and the drain region of the semiconductor.

7 Claims, 29 Drawing Sheets

SEMICONDUCTOR TFT, PRODUCING METHOD THEREOF, SEMICONDUCTOR TFT ARRAY SUBSTRATE AND LIQUID CRYSTAL DISPLAY USING THE SAME

This application is a Division of application Ser. No. 09/013,938 filed on Jan. 27, 1998.

BACKGROUND OF THE INVENTION

The present invention relates to a semiconductor thin film transistor, a producing method thereof, a semiconductor thin film transistor array substrate and a liquid crystal display using the semiconductor thin film transistor array substrate.

More particularly, the present invention relates to an improvement in electric characteristics of a thin film transistor, especially of a thin film transistor that is used in an active matrix type liquid crystal display, and the improvements in electric characteristics particularly being a decrease in serial resistance, a decrease in light generated current when light is irradiated, and a decrease in OFF current.

Switching elements, so-called thin film transistors (hereinafter referred to as "TFT"), that are used in active matrix type liquid crystal displays are classified, depending on the arrangement thereof, as to be either of direct stagger or inverted stagger structure. TFTs of inverted stagger structure are further classified into etching-stopper type TFT (ES-TFT) and channel etch type TFT ("CE-TFT"). FIG. 21(a) and FIG. 21(b) are sectional, explanatory view showing a conventional channel etch type TFT, and FIG. 21(a) is a sectional view showing an arrangement of an etching stopper type TFT ("ES-TFT") and FIG. 21(b) of a channel etch type TFT (CE-TFT). In FIG. 21(a) and FIG. 21(b), 201 denotes a gate electrode, 202 a gate insulating film, 207a and 207b a source electrode of two-layer structure, 207c and 207d a drain electrode of two-layer structure, 209a a channel region, 213 an etching stopper film, 214 an amorphous silicon film doped to be of n-type, 221 an insulating substrate, and 223 a channel layer, respectively.

All types of TFTs have an advantage as well as a disadvantage. For instance, since an interface between an etching stopper and an amorphous silicon layer is purely formed in an ES-TFT, characteristics of small OFF current can be obtained. However, on the other hand, it is disadvantaged in terms of small-sizing, since a patterning size of the etching stopper and separation of source electrode and drain electrode running on the etching stopper are prescribed by a transferring accuracy of a transferring device (stepper) so that small-sizing is made difficult, and further, the asymmetrical arrangement of the source electrode and the drain electrode with respect to the etching stopper may result in asymmetric characteristics. To be of asymmetric characteristics means that current-voltage current characteristics differ when the source electrodes is made to be a grounded electrode and when the drain electrode is made to be the grounded electrode. Comparing with this, a CE-TFT is advantageous when comparing with an ES-TFT since small-sizing thereof can be easily performed and the characteristics thereof are not made asymmetric; however, since separation of the source electrode and the drain electrode is performed by etching a channel region of an amorphous silicon layer in which current is supplied, an etching damage exists in the channel region whereby an increase in off current originating therein is observed. Further, the etching of the channel region necessarily results in a thick layer in order to prevent vanishing of the amorphous silicon layer in the channel region due to overetching. Such a thick layer presents such a drawback that it results in an increase in serial resistance in an area between the source electrode to the channel region and an increase in light generated current. With such a background being present, ES-TFT and CE-TFT are coexisting for structures of TFTs used in an active matrix type liquid crystal device.

It will now be explained for a conventional producing method of a CE-TFT (prior art 1) in details with reference to the drawings. FIG. 22(a) to FIG. 22(c) and FIG. 23(a) to FIG. 23(c) are a sectional, explanatory diagram showing each of the processes for producing a conventional CE-TFT. A process flow will now be explained based on FIG. 22(a) to FIG. 22(c) and FIG. 23(a) to FIG. 23(c). First, a Cr film of approximately 300 nm which is to be a gate electrode 201 is deposited onto an insulating substrate 221 made of glass or the like by sputtering method. This is shown in FIG. 22(a). Next, continuous film forming is performed by forming a silicon nitride film (SiNx) as a gate insulating film 202, an amorphous silicon layer, and an amorphous silicon layer doped to be n-type (n-type amorphous silicon layer) 214 as a channel layer 223 through plasma Chemical Vapor Deposition (CVD). The thickness of the gate insulating layer 202 is 300 to 400 nm, that of the amorphous silicon layer 200 to 400 nm, and that of the amorphous silicon layer doped to a n-type 214 (n-type amorphous silicon layer) 50 to 100 nm. This is shown in FIG. 22(b). Then, the amorphous silicon layer which is to be the channel layer and the n-type amorphous silicon layer 214 are patterned in a shape of an island through dry etching. This is shown in FIG. 22(c). Thereafter, source electrode 207a, 207b, and drain electrode 207c, 207d are formed by successively disposing Cr and Al in this order as a two-layer arrangement through sputtering, by patterning through photolithography, and by removing the Cr film and the Al film from the channel region 209 through etching. This is shown in FIG. 23(a). Next, etching through dry etching is performed to completely remove etching residues on a region between the source electrode and drain electrode, that is, on the n-type amorphous silicon layer 214 of the channel region 209. At this time, a part of the amorphous silicon layer of the channel region is also etched by overetching. The amount of overetching is 50 to 100 nm. A diagram of this process is shown in FIG. 23(b). Lastly, a passivation film 210 is formed of silicon nitride film to obtain a channel each type TFT (CE-TFT). This is shown in FIG. 23(c).

When applying a channel etch TFT (CE-TFT) to an active matrix type liquid crystal display to improve the display characteristic thereof, the following mutually related characteristics are required to be improved by decreasing the thickness of the amorphous silicon layer that is to be the channel layer. These characteristics are (1) a decrease in serial resistance, (2) a decrease in light generated current, (3) a decrease in off current originated in junction, and (4) a decrease in off current originated in back channel interface. Each of these will now be explained in detail.

(1) Decrease in serial resistance will first be explained. As shown in the process flow of the prior art, CE-TFT requires an overetching process to completely remove residues of amorphous silicon doped to be n-type that exist between the source electrode and the drain electrode (hereinafter referred to as "between the source and the drain") after forming the source electrode and the drain electrode. If the residue remains without being removed, it may cause inconveniences in that the n-type amorphous silicon layer residue of low resistance may cause a short-circuit between the source and the drain or in that a silicide film formed by the amorphous silicon and Cr may cause a short-circuit between the source and the drain. Since the selective ratio of the etching for the n-type amorphous silicon layer and the amorphous silicon layer that is to be the channel region is small, the amorphous silicon layer that is to be the channel region is also etched by overetching. In order to prevent a cut between the source and the drain due to overetching, the film thickness of the amorphous silicon layer that is to be the channel region needs to be thick so that the thickness of the amorphous silicon layer which was of approximately 100 nm in an ES-TFT needs to be 200 to 400 nm in CE-TFT. Since the amorphous silicon layer that is to be the channel region is not doped and thus becomes to be a layer of high resistance, it greatly influences the TFT characteristics so that no sufficient current can be obtained in terms of current-voltage characteristics.

Next, (2) decrease in light generated current will now be explained. Since a current generated through irradiation of light (hereinafter referred to as "light generated current") causes a degradation in display characteristics, the light generated current needs to be decreased. This light generated current is closely related to the thickness of the amorphous silicon layer and increases with an increase in film thickness. As noted in item (1) decrease in serial resistance, the film thickness of the amorphous silicon layer in CE-TFT is thick so that the amount of light generated current also increases.

Next, (3) decrease in off current originated in junction will be explained. The off current needs also be decreased for improving the display characteristics. There are known several mechanisms through which off currents are generated, and one of these is a destruction of junction in an abrupt junction of n-type amorphous silicon layer and a non-doped amorphous silicon layer. In forming n-type amorphous silicon layer in conventional CE-TFTs, CVD is employed. Therefore, the interface between the n-type amorphous silicon layer and the non-doped amorphous silicon layer is made to be a so-called abrupt junction so that its impurity profile becomes steep, thereby resulting in a high electric field and thus a large OFF current. This applies also to ES-TFT. To improve such a steep of impurity profile, the impurity profile (a profile of impurity concentration) is made to be oblique by employing an ion implantation method for the doping in order to decrease a steep peak in field intensity as that in an interface of abrupt junction for ease of electric field, and by forming a so-called gentle junction, the OFF current can be decreased. In forming a junction of amorphous silicon semiconductor and a region of the amorphous silicon semiconductor doped, for instance, with n-type impurities, an "abrupt junction" is obtained by keeping the doping density constant over the whole region that is to be doped with n-type impurities and by making the doping density abruptly change at the interface of junction. On the other hand, a "gentle junction" is obtained by gradually decreasing the doping density in the region that is to be doped with n-type impurity in approaching the interface of junction, and by making the doping density gently change at the interface of the junction so that the density in the proximity of the interface of junction is made low. In terms of intensity of electric field at the interface of junction, the impurity density abruptly changes from a constant value to 0 (zero) at the interface in case of abrupt junction so that the intensity of electric field at this time shows a steep peak E1 with the interface between, while in case of gentle junction, a gentle and low peak E2 (E1>E2) is seen since the impurity density gradually changes at the interface. As explained so far, while it is possible to decrease off current by forming a gentle junction, the restriction in that an impurity is doped also into the channel region in the process flow makes the application of ion implantation method to CE-TFT of conventional structure difficult.

Next, (4) decrease in OFF current originated in back channel interface will be explained. A back channel is a portion of the amorphous silicon layer not at the side which contacts the gate insulating film but contacting the passivation insulating film, and a back channel interface is an interface between the amorphous silicon layer and the passivation film. In CE-TFT, when separating a conductive film which has once been formed over the whole surface into source electrode and a drain electrode, etching of the amorphous silicon layer that is to be the channel region is also performed. Through this etching, unevenness is generate d on the interface between the amorphous silicon layer that is to be the channel region and the passivation film, and defaults due to damages caused by plasma at etching or interface levels due to dangling bonds of atoms are formed so that an increase in OFF current is seen with this interface level being a pass.

The present invention has been made with the aim of providing a thin film transistor of an arrangement which enables forming of a thin amorphous silicon layer, gentle impurity profile and a pure back channel interface, and a producing method thereof to solve the problems of the prior art 1.

Further, a matrix type liquid crystal display is usually arranged in that a display material such as liquid crystal is interposed and held between two substrates, that is, a thin film transistor array substrate (semiconductor TFT array substrate, or TFT array substrate) provided with, for instance, a thin film transistor of semiconductor thin film (semiconductor TFT) and an opposing substrate, wherein voltage is selectively impressed to each pixel of the display material. The opposing substrate is provided with an opposing electrode, color filter, black matrix or the like. Such a liquid crystal display (LCD) employing such a TFT array substrate will be hereinafter referred to as "TFT-LCD".

As shown in an equalizing circuit of FIG. 24, pixels are arranged in a matrix manner in the TFT array substrate. FIG. 24 is a circuit diagram showing an example of an electric equivalent circuit for a TFT formed on a conventional TFT array substrate.

In FIG. 24, numeral 10 denotes a TFT, numeral 11 a storage capacitance (hereinafter referred to as "Cs capacitance"), G1, G2, and G3 a scanning signal line, S1, S2, and S3 an image signal line, and Cs1, Cs2, and Cs3 a Cs wiring for forming storage capacitance. A pixel electrode is formed of a transparent electrode such as ITO (indium tin oxide), and controls charge/discharge of charge to the pixel electrode with the TFT serving as a switching element. ON/OFF control of the TFT is performed by using the scanning signal line as a gate electrode. The pixel electrode is connected to the image signal line through the TFT and according to the height of signal levels of the image signal, the amount of charge supplied to the pixel electrode varies whereby the potential of the pixel electrode is set. Depending on the voltage between the pixel electrode and opposing electrode, the displacement amount of the liquid crystal varies whereby the amount of light transmission from the rear face varies. Therefore, by controlling the signal level of the image signal line, changes in optical signal are controlled and displayed as images.

In order to improve the quality of image, it is required to keep fluctuations in the potential of the pixel electrode (hereinafter referred to as "pixel potential") caused by changes in signal level of, for instance, the scanning signal line as small as possible. Therefore, a Cs capacitance 11 is provided for the pixel electrode to provide a large total capacitance related to the pixel electrode. The Cs capacitance is formed by providing an insulating film between a Cs line which is equal in potential as the opposing electrode and the pixel electrode.

Next, a pixel layout in a conventional TFT array substrate is shown in FIG. 25, and an example of a TFT manufactured based on the pixel layout is shown in FIG. 26(a), FIG. 26(b), FIG. 27(a) and FIG. 27(b) which show sectional arrangements thereof. Further, an example of a conventional manufacturing method of a TFT is shown in FIG. 28(a) to FIG. 28(f) and FIG. 29(a) to FIG. 29(d).

FIG. 25 is a plan, explanatory view of a conventional pixel layout, and in FIG. 25, 6 denotes a pixel electrode, 7 a drain electrode, 8 a source electrode, 13 a gate line, 14 a source line, 15 a Cs wiring and 16 a semiconductor thin film. FIG. 26(a), FIG. 26(b), FIG. 27(a) and FIG. 27(b) are sectional, explanatory diagram showing a sectional arrangement of a TFT as shown in FIG. 25 cut along line A—A. In FIG. 26(a), FIG. 26(b), FIG. 27(a) and FIG. 27(b), numeral 1 denotes a glass substrate, numeral 2 denotes a gate electrode of the TFT, numeral 3 denotes a gate insulating film, numeral 4 denotes an i-layer, numeral 5 denotes an n-layer, numeral 6 denotes a pixel electrode, numeral 7 denotes a drain electrode, numeral 8 denotes a source electrode, numeral 9 denotes a DC cut film employed as the insulating film, reference character Rss denotes an ON resistance at the side of the source electrode, reference character Rsd denotes an ON resistance at the side of the drain electrode, and reference character Rsc denotes an ON resistance at the side of the channel. Reference character D denotes connection to the drain electrode, reference character G denotes connection to the gate electrode, and reference character S denotes connection to the source electrodes. Further, the i-layer is a layer of intrinsic semiconductor, and the n-layer is a layer of n-type semiconductor. The DC cut film 9 is provided for protecting the metal wiring in underlying layers and formed of silicon nitride film (SiNx) by, for instance, a plasma CVD method. The DC cut film may also be a passivation film. It should be noted that, in this specification, a region on which the source electrode is formed is called a source region, a region on which the drain electrode is formed a drain region, and a region between the source electrode and drain electrode a channel region. Also, a channel formed in a region on the i-layer opposite to the gate insulating film is called back channel. Further, a region in which the pixel electrode is formed is called a pixel region.

FIG. 28(a) to FIG. 28(f) and FIG. 29(a) to FIG. 29(d) are a sectional, explanatory diagram showing each of the processes performed in a conventional manufacturing method of a TFT. Portions of FIG.28(a) to FIG. 28(f) and FIG. 29(a) to FIG. 29(d) that are identical to those as shown in FIG. 25, FIG. 26(a), FIG. 26(b), FIG. 27(a) and FIG. 27(b) are indicated by the same reference numerals and 111, 112, 113, and 114 denote resists. In FIG. 28(a), a first metal thin film is formed onto glass substrate 1 that is to be an gate electrode, and after developing a pattern of resist 111, the first metal thin film is etched to form an gate electrode 2 as shown in FIG. 28(b). After removing resist 111, a gate insulating film 3, i-layer 4 and n-layer 5 are formed in this order from the bottom as shown in FIG. 28(c), and after developing a pattern of resist 112, the i-layer 4 and n-layer 5 are etched as shown in FIG. 28(d). After removing resist 112, an ITO thin film is formed that is to be a pixel electrode as shown in FIG. 28(e), and by etching the ITO thin film after developing a resist 113, a pixel electrode 6 is formed as shown in FIG. 28(f). After removing the resist 113, a metal thin film is formed that is to be the source electrode and the drain electrode as shown in FIG. 29(a), and by etching after developing a pattern of resist 114, the source electrode and drain electrode are formed as shown in FIG. 29(b). Further, by etching the entire n-layer and a part of the i-layer and the side of the back channel of the TFT (back channel etching) and removing, as shown in FIG. 29(c), the resist, a DC cut film 9 is formed as an insulating film as shown in FIG. 29(d).

The TFT, gate line, source line, and other common line are thus formed in a form of an array on the glass substrate to provide a display region, and an input terminal, an auxiliary line and an insulating film are arranged in the periphery of the display region. At this time, conductive layers or insulating layers may be provided, when required, to make each of the functions work. The opposing substrate is provided thereon with an opposing electrode, a color filter and a black matrix.

After manufacturing a TFT array substrate and an opposing substrate, both substrates are stuck together at their circumference with a desired space formed therebetween so that a liquid crystal material may be implanted between the two substrates, a liquid crystal material is then implanted between the two substrates to obtain a liquid crystal display.

The arrangement and function of a conventional TFT will now be explained taking a case of prior art 2 as an example. When charging the pixel electrode 6 with electric charge in FIG. 26(a), the TFT is turned to an ON condition by impressing a voltage of approximately 9 V to the source electrode 8 and a positive voltage of approximately 20 V to the gate electrode 2. On the other hand, the drain electrode 7 and the pixel electrode 6 are charged to nearly 9 V. Thereafter, when the potential of the pixel electrode has been sufficiently raised, a negative voltage of approximately −5 V is impressed to the gate electrode 2 to turn the TFT off to confine electric charge in the pixel.

When performing the series of actions until confinement of electric charge in the pixel has been achieved, the degree of raising of the pixel electrode potential depends largely on the size of volume connected to the pixel electrode 6 and the ON resistance of the TFT. The ON resistance of TFT in a conventional TFT may be virtually considered to be cut off a section in the proximity of the channel of the TFT as in FIG. 26(b) and as to be separated into each component of the resistance in accordance with the sectional arrangement, as shown in FIG. 27(a). That is, the ON resistance is the Rss at the side of the source electrode, Rsc of the channel portion and Rsd at the side of the drain electrode. Since the drain electrode 7 and source electrode 8 are made of metal thin film, the resistance of the n-layer 5 provided in an underlying layer of these electrodes is sufficiently small than compared to Rss, Rsc and Rsd, the resistance of the n-layer 5 is of ignorable level as an ON resistance of TFT.

Therefore, the TFT may be expressed to be an equivalent circuit in which the side of the drain electrode is connected to Rsd resistance, and the side of the source electrode to a Rss resistance, as shown in FIG. 27(b). The symbolic expressions in circles representing terminals of the circuit as shown in FIG. 27(b) denote connection to the drain electrode, connection to the source electrode, and connection to the gate electrodes, respectively. A conventional TFT presented a drawback in that a large resistance Rss and Rsd resulted in a large ON resistance, whereby the pixel electrode could not be sufficiently charged within a specified time.

A conventional TFT also presented a drawback that the ON resistance was high and the driving performance of the TFT poor, because the Rss and Rsd had resistance values of the same level as the Rsc. This was because the underlying layer of the source electrode and the underlying layer of the drain electrode were provided with n-layer and i-layer in this order from the side of the source electrode and drain electrode and the channel region was comprised of i-layer, there existed an ON resistance Rss in the underlying layer of the source electrode, an ON resistance Rsd in the underlying layer of the drain electrode and a resistance Rsc in the channel region.

In the TFT arrangement of a conventional TFT array substrate, a large serial resistance is connected to the side of the source electrode and the side of the drain electrode of the TFT whereby the ON resistance of the TFT is high. Therefore, a long time was necessary to charge the pixels with a specified potential. With an increase in number of display pixels of the TFT-LCD from XGA (extended graphics array), SXGA (super extended graphics array), and to UXGA (ultra extended graphics array), the time for charging assigned per pixel will become short, whereby sufficient charge within a specified time was difficult to be achieved and thus caused a degradation in display quality.

Characteristic, of the TFT largely depend on the thickness of the gate insulating film, the thickness of the i-layer underlying the source electrode or the drain electrode that constitute the TFT, or the thickness of the i-layer of the channel portion after etching (hereinafter, the film thickness after etching will be referred to as "remaining film thickness"). As the size of TFT ally substrates increases, the range of TFT characteristics within the substrate surface is largely varied depending on whether the range of variations in operating conditions can be made uniformly, that is, whether a film can be uniformly formed in the substrate surface or whether etching can be uniformly performed in the substrate surface. However, since the entire n-layer at the side of the back channel of the whole TFT of the substrate surface needs to be removed in back channel etching, it is usually required to set a rather large etching time than a time required for removing the entire n-layer in view of the range of variation in the film thickness of the n-layer as well as the range of variation in the etching action. Therefore, the i-layer in the channel region of the TFT is also thickly etched, and a variation is caused also in the remaining film thickness. Accordingly, it resulted in a variation of TFT characteristics in the substrate surface and also in a range in uniformity of the display characteristics of the TFT-LCD.

The present invention has been made to solve the problems of the prior art 2 in that a range in uniformity of the above-described display characteristics is caused, and it is an object of the present invention to provide a TFT capable of decreasing ON resistance of TFT, and of making a range of TFT characteristics small, a producing method thereof, and a TFT array substrate and by improving the driving performance and the uniformity of TFT characteristics in the display surface to realize a TFT-LCD of high display quality.

SUMMARY OF THE INVENTION

An embodiment of the present invention is characterized in that a junction in which serial resistance is small impurity profile is gentle is obtained by forming an amorphous silicon layer which is to be channel layer that is thinner than a conventional one, forming a resist mask on the amorphous silicon layer by photolithography, and forming a junction through ion implantation method.

Therefore, a TFT according to a first embodiment of the present invention is a TFT comprising of an insulating substrate, a first conductive film layer which is to be a gate electrode provided on the insulating substrate, a first insulating film layer which is to be a gate insulating film layer provided on the first conductive film layer, a non-doped semiconductor layer formed on the first insulating film layer, and a second conductive film layer which is to be a source electrode formed on a source region of the semiconductor layer and a drain electrode formed on a drain region of the semiconductor, characterized in that a junction is formed by implanting an n-type impurity in the source region of the semiconductor layer and the drain region of the semiconductor layer.

The producing method of the TFT according to the first embodiment of the present invention is characterized in that it comprises the steps of:
 (a) providing a gate electrode by forming a first conductive film on an insulating substrate and etching the first conductive film;
 (b) forming a first insulating layer and a non-doped semiconductor layer on the gate electrode and patterning the semiconductor layer in a form of an island;
 (c) forming a junction by forming a resist layer on the semiconductor layer by photolithography and implanting an n-type impurity with the resist film being a mask; and
 (d) providing a source electrode and gate electrode by removing the resist film, forming a second conductive film, forming an electrode pattern on the second conductive film by photolithography, and etching the second conductive film.

A producing method of a TFT according to the third embodiment of the present invention is characterized in that it comprises the steps of:
 (a) providing a gate electrode by forming a first conductive film on an insulating substrate and etching the first conductive film;
 (b) forming a first insulating layer and a non-doped semiconductor layer on the gate electrode and patterning the semiconductor layer in a form of an island;
 (c) forming a junction by forming a resist layer on the semiconductor layer by photolithography and implanting an n-type impurity by ion implantation through rotating oblique implantation with the resist film being a mask; and
 (d) providing a source electrode and gate electrode by removing the resist film, forming a second conductive film, forming an electrode pattern on the second conductive film by photolithography, and etching the second conductive film.

A TFT according to a fourth embodiment of the present invention is a thin film transistor comprised of an insulating substrate, a first conductive film layer serving as a gate electrode provided on the insulating substrate, a first insulating film layer serving as a gate insulating film layer provided on the first conductive film layer, a non-doped semiconductor layer formed on the first insulating film layer, and a second conductive film layer which is to be a source electrode formed on a source region of the semiconductor layer and a drain electrode formed on a drain region of the semiconductor layer, characterized in that a junction is formed by implanting an n-type impurity in the source region of the semiconductor layer and the drain region of the semiconductor layer, and a portion of the semiconductor layer that is underlying the source electrode and underlying the drain electrode is also implanted with an n-type impurity.

A producing method of a TFT according to a fifth embodiment of the present invention is characterized in that it comprises the steps of:
(a) providing a gate electrode by forming a first conductive film on an insulating substrate and etching the first conductive film;
(b) forming a first insulating layer and a non-doped semiconductor layer on the gate electrode;
(c) forming a resist film on the semiconductor layer, forming a resist pattern on the resist film by exposing from a rear side of the insulating substrate and implanting an n-type impurity through ion implantation by using the resist pattern as a mask;
(d) removing the resist film; and
(e) forming a source electrode and a gate electrode by forming a second conductive film, by forming an electrode pattern on the second conductive film by photolithography, and by etching the second conductive film.

A producing method according to a sixth embodiment of the present invention is characterized in that it comprises the steps of:
(a) providing a gate electrode by forming a first conductive film on an insulating substrate and etching the first conductive film;
(b) forming a first insulating layer and a non-doped semiconductor layer on the gate electrode;
(c) forming a resist film on the semiconductor layer, forming a resist pattern on the resist film by exposing from a back side of the insulating substrate and implanting an n-type impurity through ion implantation by rotating oblique implantation by using the resist pattern as a mask;
(d) removing the resist film; and
(e) forming a source electrode and a gate electrode by forming a second conductive film, by forming an electrode pattern on the second conductive film by photolithography, and by etching the second conductive film.

A semiconductor TFT according to a seventh embodiment of the present invention is comprised of
an insulating substrate,
a gate line formed on the insulating substrate,
a gate insulating film formed on the gate line,
an intrinsic semiconductor layer formed on the gate insulating film,
a source electrode formed in a source region of the intrinsic semiconductor, and
a drain electrode formed in a drain region of the intrinsic semiconductor,
wherein the source region and the drain region of the intrinsic semiconductor layer are of n-layer obtained by implanting impurities, and the channel region of the intrinsic semiconductor layer is an i-layer with no impurities being implanted.

A semiconductor TFT array substrate according to an eighth embodiment of the present invention wherein the semiconductor TFT array substrate is comprised of
a transparent insulating substrate,
a plurality of gate lines arranged to be parallel with respect to each other on the transparent insulating substrate,
a plurality of source lines arranged to cross each of the plurality of gate lines and to be parallel with respect to each other,
a TFT provided on each crossing portion of the plurality of gate lines and the plurality of source lines,
a pixel electrode of transparent conductive film connected to a drain electrode of the TFT, and
a storage capacitance electrode line in which a storage capacitance is formed by interposing an insulating film together with the pixel electrode,
wherein the TFT is composed of
a gate line formed on the insulating substrate,
a gate insulating film formed on the gate line,
an intrinsic semiconductor layer formed on the gate insulating film,
a source electrode formed in a source region of the intrinsic semiconductor layer, and
a drain electrode formed in a drain region of the intrinsic semiconductor layer,
wherein the source region and the drain region of the intrinsic semiconductor layer are of n-layer obtained by implanting impurities, and the channel region of the intrinsic semiconductor layer is an i-layer with no impurities being implanted.

It is preferable that a region from a lower surface of the source electrode to an upper surface of the gate insulating film and a region from a lower surface of the drain electrode to an upper surface of the gate insulating film are of n-layer, whereby the driving performance of the TFT is improved by a decrease in resistance of the source region and by a decrease in resistance of the drain region.

It is preferable that a region from a lower surface of the source electrode to a proximity of an upper surface of the gate insulating film and a region from a lower surface of the drain electrode to a proximity of an upper surface of the gate insulating film are of n-layer, whereby the driving performance of the TFT is improved by a decrease in resistance of the source region and by a decrease in resistance of the drain region.

A semiconductor TFT according to a ninth embodiment of the present invention is comprised of
an insulating substrate,
a gate line formed on the insulating substrate,
a gate insulating film formed on the gate line,
an intrinsic semiconductor layer formed on the gate insulating film,
a source electrode formed in a source region of the intrinsic semiconductor layer, and
a drain electrode formed in a drain region of the intrinsic semiconductor layer,
wherein the source region and the drain region of the intrinsic semiconductor layer are of n-layer obtained by implanting impurities through an n-type semiconductor thin film temporarily provided on the intrinsic semiconductor layer, and the channel region of the intrinsic semiconductor layer is an i-layer with no impurities being implanted.

A semiconductor TFT array substrate according to a tenth embodiment of the present invention is comprised of
a transparent insulating substrate,
a plurality of gate lines arranged to be parallel with respect to each other on the transparent insulating substrate,
a plurality of source lines arranged to cross each of the plurality of gate lines and to be parallel with respect to each other,
a TFT provided on each crossing portion of the plurality of gate lines and the plurality of source lines, a pixel electrode of transparent conductive film connected to a drain electrode of the TFT, and a storage capacitance electrode line whereby a storage capacitance is formed by interposing an insulating film together with the pixel electrode, wherein the TFT is composed of the gate line formed on the insulating substrate, a gate insulating film formed on the gate wiring, an intrinsic semiconductor layer formed on the gate insulating film, a source electrode formed in a source region of the intrinsic semiconductor layer, and a drain electrode formed in a drain region of the intrinsic semiconductor layer, wherein the source region and the drain region of the intrinsic semiconductor are of n-layer obtained by implanting impurities through an n-type semiconductor thin film temporarily provided on the intrinsic semiconductor layer, and the channel region of the intrinsic semiconductor layer is an i-layer with no impurities being implanted.

It is preferable that a region from a lower surface of the source electrode to an upper surface of the gate insulating film and a region from a lower surface of the drain electrode to an upper surface of the gate insulating film are of n-layer, whereby the driving performance of the TFT is improved by a decrease in resistance of the source region and by a decrease in resistance of the drain region.

It is preferable that a region from a lower surface of the source electrode to a proximity of an upper surface of the gate insulating film and a region from a lower surface of the drain electrode to a proximity of an upper surface of the gate insulating film are of n-layer, whereby the driving performance of the TFT is improved by a decrease in resistance of the source region and by a decrease in resistance of the drain region.

A producing method for a semiconductor TFT according to an eleventh embodiment of the present invention comprising the steps of:

(1) forming a gate line by forming a first metal thin film on an insulating substrate and subjecting to patterning it thereafter, (2) forming a gate insulating film so as to cover the gate line, (3) forming an intrinsic semiconductor layer by forming an intrinsic semiconductor thin film on the gate insulating film and patterning a source region, a drain region as well as a channel region of the intrinsic semiconductor thin film thereafter, (4) forming a resist on the channel region of the intrinsic semiconductor layer, ion implanting impurities onto the intrinsic semiconductor layer to change both, the source region and the drain region of the intrinsic semiconductor layer, to an n-layer and the channel region of the intrinsic semiconductor layer to an i-layer, and further removing the resist, (5) forming a transparent conductive film by covering the intrinsic semiconductor layer, and patterning a pixel region of the transparent conductive film to obtain a pixel electrode and removing the transparent conductive film of portions other than for the pixel electrode, and (6) respectively forming a source electrode and a drain electrode by forming a second metal thin film by covering the intrinsic semiconductor layer, and patterning a source region and a drain region of the second metal thin film.

A producing method for a semiconductor TFT according to a twelfth embodiment of the present invention comprising the steps of:

(1) forming a gate line by forming a first metal thin film on an insulating substrate and subjecting to patterning it thereafter, (2) forming a gate insulating film as to cover the gate line, (3) forming an intrinsic semiconductor thin film on the gate insulating film, forming a resist on a channel region of the intrinsic semiconductor thin film, and implanting impurities on regions other than the channel region of the intrinsic semiconductor thin film to change all regions except for the channel region into an n-type semiconductor thin film, (4) patterning the source region and the drain region of the n-type semiconductor thin film and the channel region of the intrinsic semiconductor thin film to be a semiconductor region portion, and making the source region and the drain region of the n-type semiconductor thin film an n-layer and the channel region of the intrinsic semiconductor thin film an i-layer by removing the n-type semiconductor thin film from portions other than the semiconductor region portion, (5) forming a transparent conductive film by covering the semiconductor region of the n-type semiconductor thin film, patterning a pixel region of the transparent conductive film to obtain a pixel electrode, and removing the transparent conductive film of portions other thin for the pixel electrode, and (6) respectively forming a source electrode and a drain electrode by forming a second metal thin film by covering the semiconductor region, and patterning a source region and a drain region of the second metal thin film.

A producing method of a semiconductor TFT according to a thirteenth embodiment of the present invention comprises the steps of:

(1) forming a gate line by forming a first metal thin film on an insulating substrate and subjecting to patterning it thereafter, (2) forming a gate insulating film as to cover the gate line, (3) forming an intrinsic semiconductor thin film on the gate insulating film, patterning a source region, a drain region as well as a channel region of the intrinsic semiconductor thin film to be a semiconductor region portion, and obtaining an intrinsic semiconductor layer by removing portions of the intrinsic semiconductor thin film other than the semiconductor region portion, (4) forming an n-type semiconductor thin film on the intrinsic semiconductor film, forming a resist on the channel region of the i-type semiconductor thin film, implanting impurities into the intrinsic semiconductor layer through the n-type semiconductor thin film, and removing the resist to change the source region and the drain region of the intrinsic semiconductor layer into an n-layer and the channel region of the intrinsic semiconductor layer into an i-layer, (5) forming a transparent conductive film by covering the n-type semiconductor thin film, patterning a pixel region of the transparent conductive film to obtain a pixel electrode and removing the transparent conductive film of portions other than for the pixel electrode, and (6) respectively forming a source electrode and a drain electrode by forming a second metal thin film by covering the n-type semiconductor thin film, and patterning a source region and a drain region of the second metal thin film.

According to the TFT and the producing method thereof according to the first to sixth embodiments of the present invention, the film thickness of the amorphous silicon layer in the channel region is made thin, whereby the serial resistance is decreased. By employing an ion implanting method for forming a junction, the impurity profile is made gentle for ease of electric field, whereby the off current is decreased. Consequently, the electric characteristics of the obtained CE-TFT is greatly improved to provide a display characteristics of stable quality.

In the TFT according to the seventh to fifteenth embodiment of the present invention, ion implantation is employed for forming an n-layer positioned as to be underlying the source electrode and drain electrode formed of a metal thin film, and when performing ion implantation, the channel region of the TFT is prevented from being implanted with impurities by covering the channel region of the TFT with a resist. By preventing impurity implantation to the channel region in this manner, the n-layer at the side of the drain and the side of the source is separated, whereby ion implantation can be performed at high energy. Consequently, the interface between the gate insulating film and the i-layer or to a proximity of the interface can be changed from an i-layer to an n-layer and thus resistance components at the side of the source electrode and at the side of the drain electrode of the TFT are made small whereby the resistance that is caused when the TFT is turned ON is made small and thus improving the driving performance of the TFT.

Further, by converting the back channel side of the TFT with a resist and preventing intrusion of n-type impurities into the channel region, the amount of etching for etching the n-layer at the side of the back channel necessary for a TFT structure requiring an ordinary back channel etching can be largely decreased. Since the amount of etching can be largely decreased simultaneous with improving the uniformity of TFT characteristics in the display surface of the array substrate, or the uniformity in the display surface of TFT-LCD, it has been enabled to make the film thickness of the i-layer thin, to decrease resistance at the side of the source and at the side of the drain of the TFT, and to improve the driving performance of the TFT.

The TFT of the TFT array substrate according to the seventh to fifteenth embodiment of the present invention is characterized in that the resistance Rss in the underlying layer of the source electrode and the resistance Rsd in the underlying layer of the drain electrode can be decreased since the i-layer underlying the source electrode of the TFT and underlying the drain electrode can be omitted or made very thin. Consequently, the ON resistance of the TFT is decreased to improve the driving performance of the TFT, and even if the number of pixels of the TFT-LCD increases, it is made possible to charge the pixel electrodes to a sufficiently high potential within a specified time assigned for the charging, whereby the display quality of the TFT-LCD can be improved.

Since an embodiment of the present invention has made it possible to omit etching of a n-layer portion of a TFT back channel portion required in an ordinary back channel etch type TFT or to largely decrease the time for etching, control of uniformity within the substrate surface concerning the remaining film thickness of the i-layer in the channel region after back channel etching can be performed easily, whereby the uniformity of TFT characteristics in the surface and the uniformity of display characteristics of the TFT-LCD in the surface can be improved.

Further, since the back channel etching can be omitted or the time for the etching largely decreased, the film thickness of the i-layer can be made thin and the resistance Rss of the underlying layer of the source electrode and the resistance Rsd of the underlying layer of the drain electrode in the TFT can be decreased, whereby the driving performance of the TFT is improved and the display characteristics of the TFT-LCD is improved.

DETAILED DESCRIPTION

Embodiments of the present invention will now be explained in details with reference to the accompanying drawings.

Embodiment 1

Figure 1A:
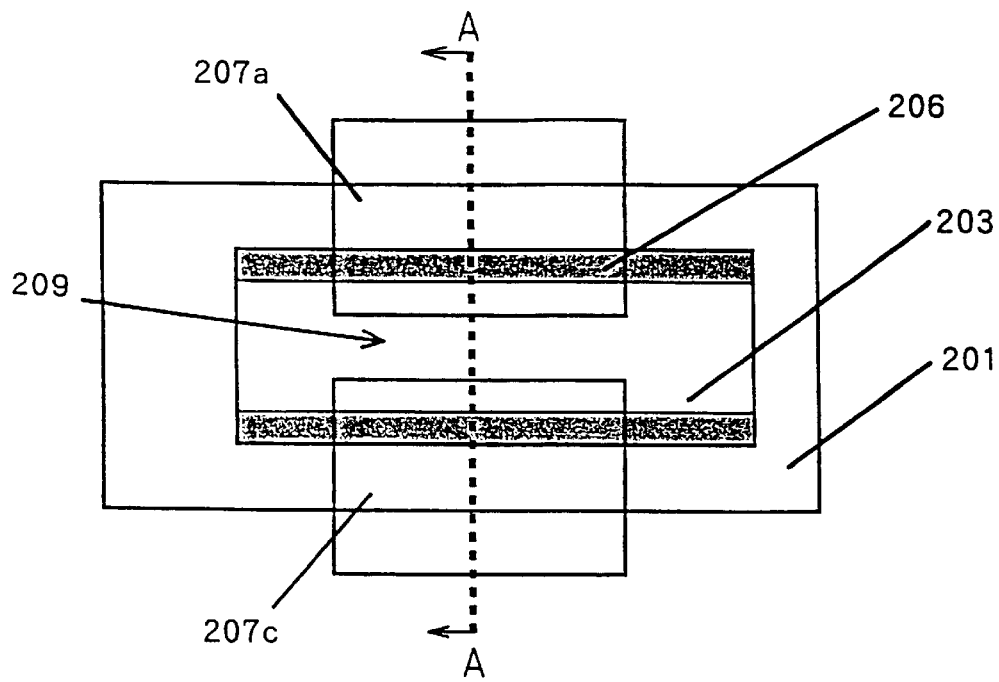
FIG. 1(a) and FIG. 1(b) are explanatory diagrams of a TFT according to an embodiment of the present invention.
Figure 1B:
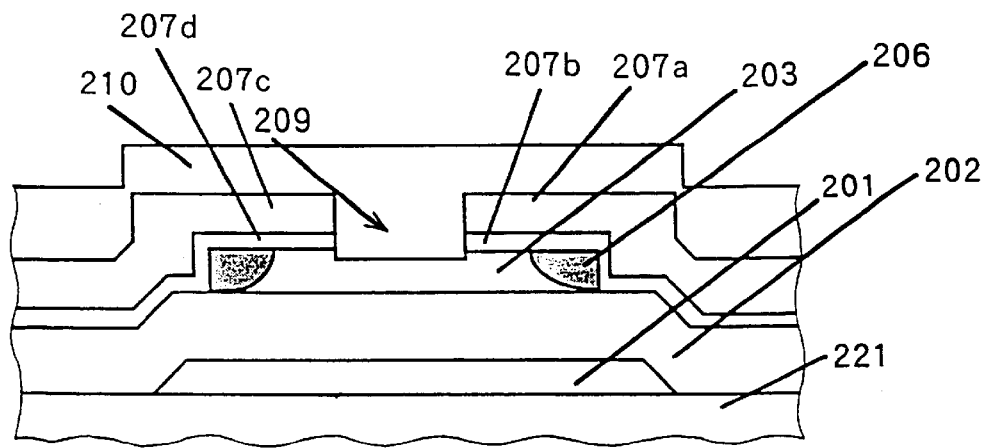
Figure 2A:
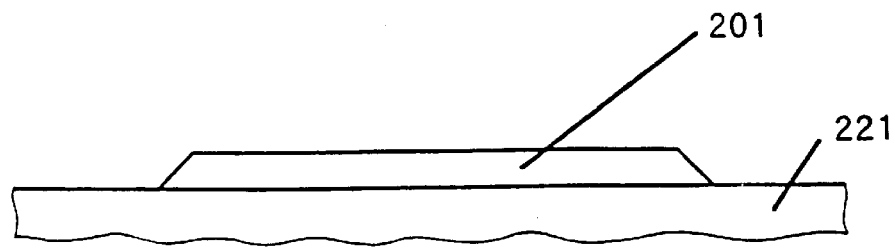
FIG. 2(a) to FIG. 2(c) are sectional, explanatory diagrams of a TFT according to an embodiment of the present invention.
Figure 2B:
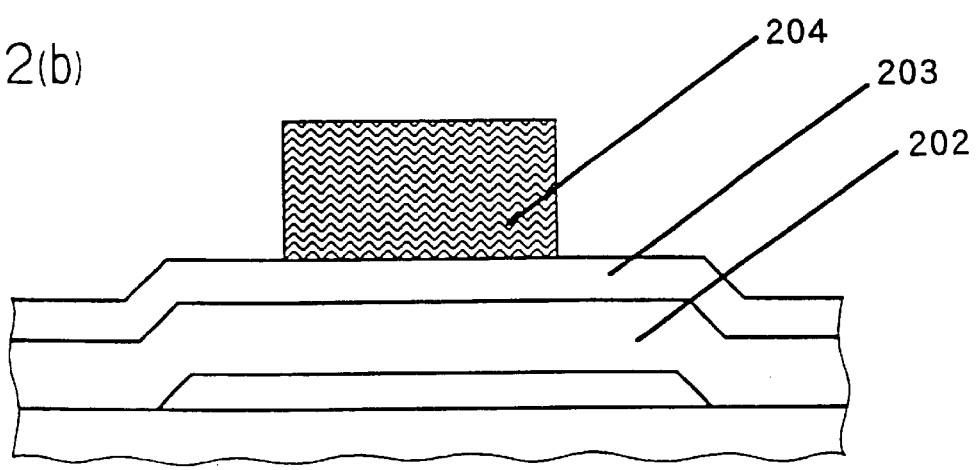
Figure 2C:
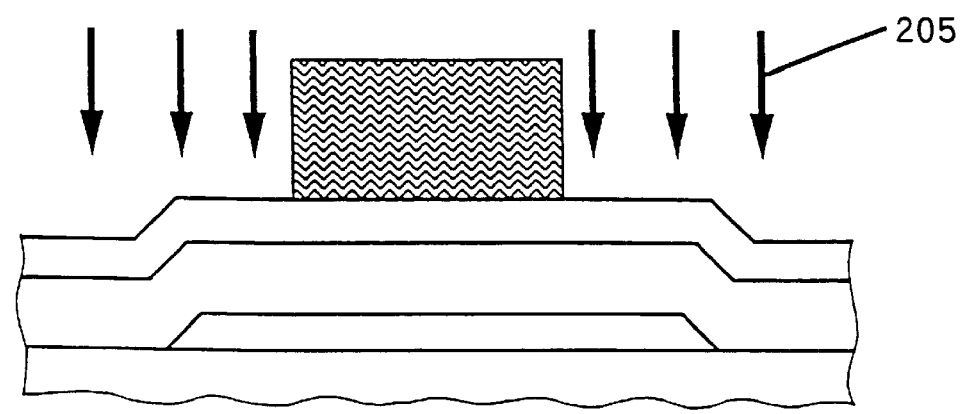
Figure 3A:
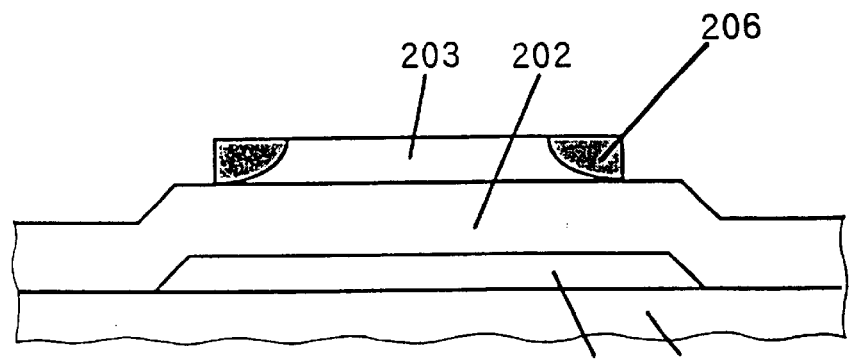
FIG. 3(a) to FIG. 3(d) are sectional, explanatory diagrams of a TFT according to an embodiment of the present invention.
Figure 3B:
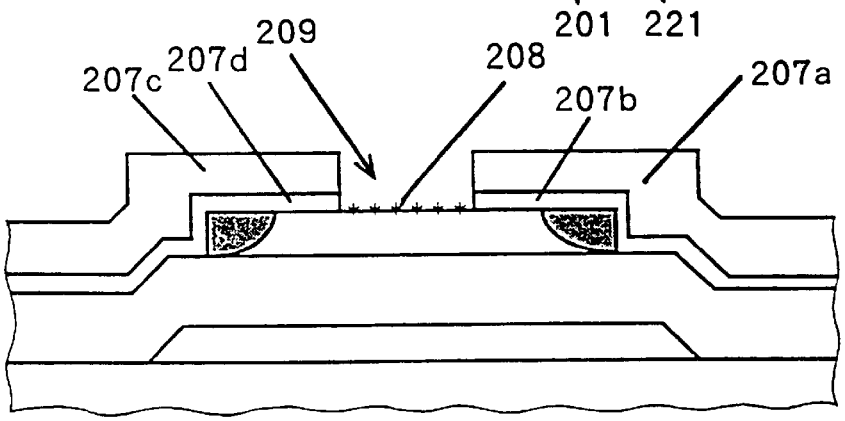
Figure 3C:
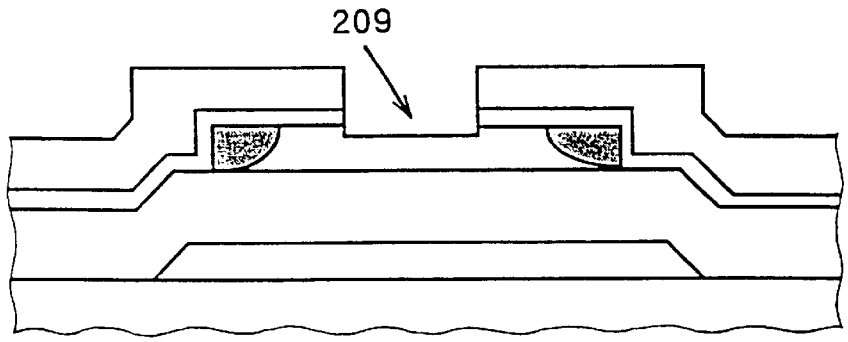
Figure 3D:
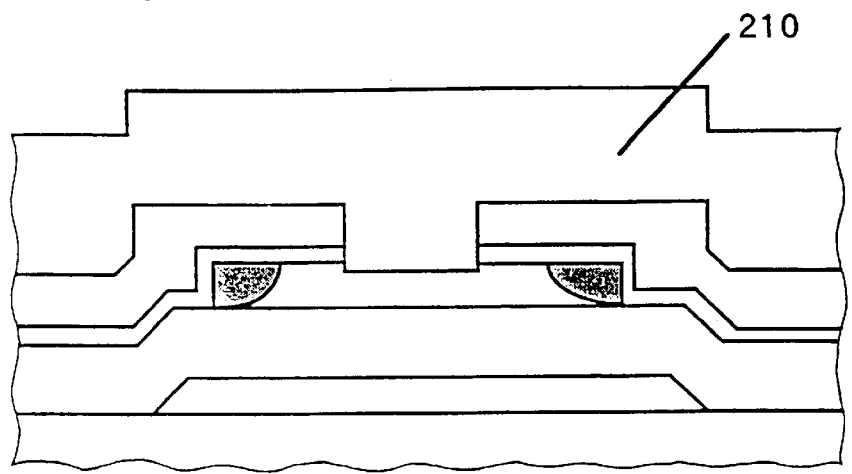

FIG. 1(a) and FIG. 1(b) are an explanatory view of a CE-TFT according to an embodiment of the present invention. FIG. 1(a) is a plan, explanatory view showing an arrangement of an electrode of the CE-TFT, and FIG. 1(b) is a sectional, explanatory view showing the CE-TFT cut along line A—A as shown in FIG. 1(a). In FIG. 1(a) and FIG. 1(b), numeral 201 denotes gate electrode which is a first conductive film layer, numeral 202 denotes a gate insulating film which is a first insulating film layer, numeral 203 denotes a channel layer which is a non-doped semiconductor layer, numeral 206 denotes an n-type impurity implantation region in the channel layer, numerals 207a and 207b denote source electrode of two-layer structure, numerals 207c and 207d denote drain electrode of two-layer structure, numeral 209 denotes a channel region, numeral 210 denotes a passivation film, and numeral 221 denotes an insulating substrate, respectively (note that the passivation film 210 is not shown in FIG. 1(a)). Further, FIG. 2(a) to FIG. 2(c) and FIG. 3(a) to FIG. 3(d) are sectional, explanatory circuit diagrams showing a manufacturing method of the CE-TFT of the present invention, and numeral 204 denotes a resist film, numeral 205 denotes an implantation of phosphorus, and numeral 208 denotes a chrome silicide film, respectively, and components that are equal to those as shown in FIG. 1(a) and FIG. 1(b) have been indicated with the same reference numerals (and the same applies to all of the drawings hereinafter).

The manufacturing method of TFT as shown in the explanatory diagram of the sectional arrangement of FIG. 1(b) will be explained based on a process flow by successively referring to FIG. 2(a) to FIG. 2(c) and FIG. 3(a) to FIG. 3(d). First, Cr film, which is a metal of low resistance and of high melting point, is formed on an insulating substrate 221 made of glass or the like by sputtering. Then, a pattern is formed by photolithography, and by forming a pattern of Cr film through etching, the gate electrode 201 is obtained (FIG. 2(a)). Next, amorphous silicon layer (i-a-Si:H) is successively formed by plasma CVD as an intrinsic, that is, a non-doped semiconductor layer which is to be the gate insulating film 202 and the channel layer 203. The film thickness for the gate insulating film is approximately 400 nm and that of the intrinsic amorphous silicon layer approximately 100 nm. Then, the resist film 204 is formed by photolithography (FIG. 2(b)). Next, implantation of phosphorus 205 is performed with the resist film serving as a mask. Since implantation energy and amount of implantation depend on the film thickness of the amorphous silicon layer serving as to be the channel layer, it is determined in accordance with the film thickness of the amorphous silicon layer. The size of implantation energy may be expressed with an implantation range Rp as an indicator, and the implantation range Rp is a central value Rp when the area which is actually implanted with impurities is expressed as an area between (Rp−Rw) and (Rp+Rw) with a width Rw with respect to the central value Rp. When expressed like this, the Rp as well as the Rw increases when the implantation energy is large.

When an implantation range Rp has been suitably selected with respect to a layer thickness (t) of an amorphous silicon layer to which impurities are to be implanted, the Rp is positioned in the center of the layer thickness t, and the area between (Rp−Rw) and (Rp+Rw) can be set as $2Rw \leq t$ with respect to the layer thickness (t); however, when no suitable selection has been made and the Rp is, for instance, too large, the selected Rp is shifted from the center of (t) and because the Rw is also made large, implantation is performed to a different, for instance, a neighboring layer other than the amorphous silicon layer to which implantation is to be performed.

When the Rp is set to be large so that implantation of impurities is performed for the insulating film which is not supposed to be implanted with impurities, the surface impurity density of the amorphous silicon layer decreases, and a region of little impurities and of high resistance will be contained in the amorphous silicon layer, resulting in a high resistance of the amorphous silicon layer and thus a degradation of TFT characteristics.

As explained above, the implantation range for the impurity, and thus, the implantation energy needs to be suitably set in accordance with the film thickness (t) of the amorphous silicon layer, and it is desirable that the implantation range Rp is less than the film thickness of the amorphous silicon layer. For instance, if the film thickness of the amorphous silicon layer is approximately 100 nm, the implantation energy is approximately 30 keV, the amount of implantation more than approximately $5E14/cm^2$, and the implantation range Rp at this time approximately 300 Å (FIG. 2(c)). Thereafter, removal of resist and photolithography is performed, and the amorphous silicon layer is etched in a form of an island (FIG. 3(a)). Then, a second conductive film is formed as a two-layer structure wherein Al is deposited on Cr foundation, and by removing etching from a channel region of the second conductive film, separation into source electrode and drain electrode is performed. For forming the two-layer structure, Cr film and an Al film are successively deposited in this order by sputtering once over the entire gate insulating film and the channel layer. An electrode pattern is formed on a region on which the source electrode is formed (source region) and on a region on which the drain electrode is formed (drain region) by photolithography, and etching of the Cr film and the Al film of a portion on the channel region 209 of the channel layer 203 from among the conductive films of two-layer structure (FIG. 3(b)). In performing this etching, a chrome silicide (CrSix) film 208, though in a minute amount, is discontinuously formed as shown symbolically in the drawings by the reaction of the Cr and the amorphous silicon layer, and because this may cause a short between the source and the drain, removal of the CrSix film is performed by dry etching (FIG. 3(c)). In this dry etching, the selective ratio of the CrSix film and the amorphous silicon layer is sufficient so that the amorphous silicon layer is not largely etched, and the thinned amorphous silicon layer is not made to be cut in the channel region. By depositing a nitride film 210 which is to be the passivation film by plasma CVD to a thickness of approximately 500 nm, the CE-TFT is completed (FIG. 3(d)). With this arrangement, since the amorphous silicon layer which is to be the channel layer is formed to be thin, and ion implantation has been employed for forming a junction of the amorphous silicon layer and the n-type impurity of the n-type impurity implantation region 206, the serial resistance between the source and the drain is made small and the increase of light generated current restricted, and since a junction of a gentle impurity profile has been formed by ion implantation, a decrease of electrical field generated on the junction interface is achieved, whereby a CE-TFT which increase in OFF current is restricted and which is of suitable TFT characteristics can be obtained.

Embodiment 2

Figure 4:
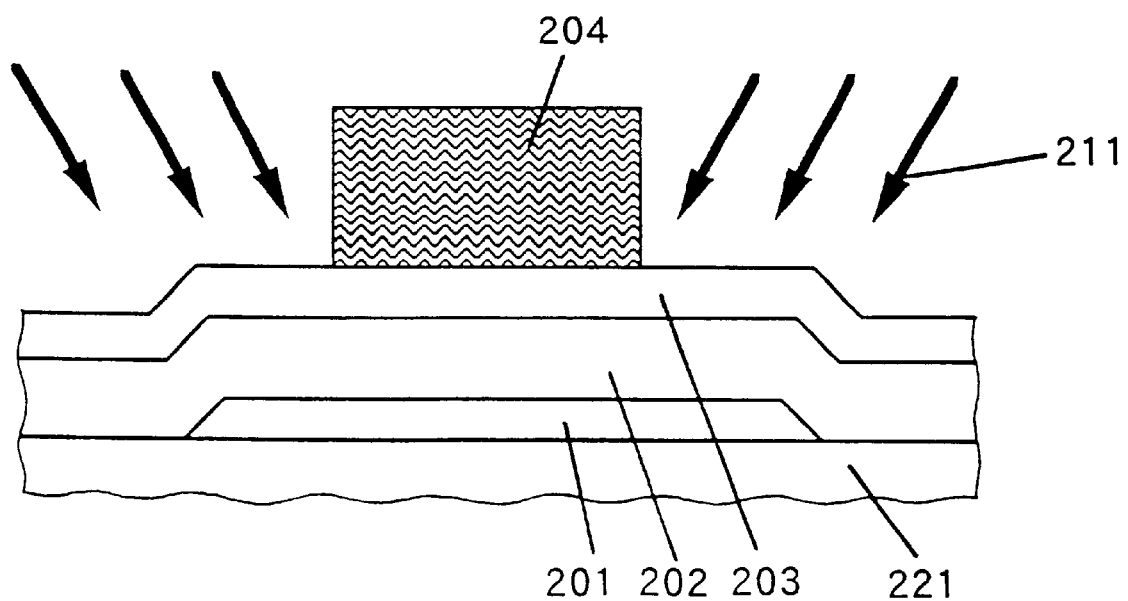
FIG. 4 is a sectional, explanatory diagram of a TFT according to another embodiment of the present invention.

In Embodiment 1, phosphorous has been implanted to an intrinsic amorphous silicon layer in a vertical manner when implanting phosphorous as an impurity. In Embodiment 2, oblique implantation 211 of phosphorous has been performed by successively rotating a stage of an ion implanting device onto which the substrate is set as shown in the sectional, explanatory drawing of a TFT according to another embodiment of the present invention. With this arrangement, an impurity profile in an interface at a junction of amorphous silicon layer which is to be a channel and an impurity implanting region is made more gentle, and at the time of operating the TFT, generation of high electric field at the junction is restricted, whereby a decrease in OFF current can be achieved. The implanting condition in this case requires selection of an implantation energy wherein the range Rp of the impurity when implanting at an implantation angle satisfies equation $Rp=d/\cos\theta$. In this equation, reference character d denotes a film thickness of the amorphous silicon layer which is to be the channel. The amount of implantation may be equal to that of Embodiment 1 (FIG. 4).

Embodiment 3

Figure 5A:
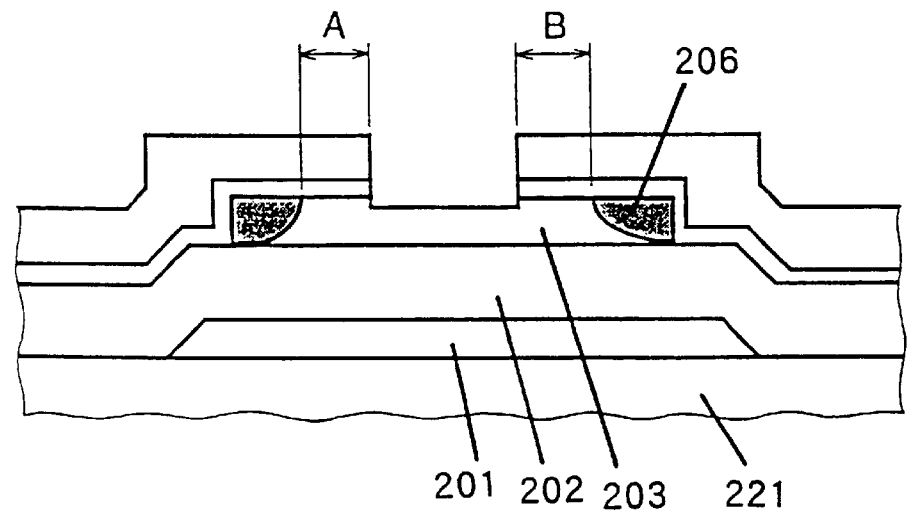
FIG. 5(a) and FIG. 5(b) are sectional, explanatory diagrams of a TFT according to another embodiment of the present invention.
Figure 5B:
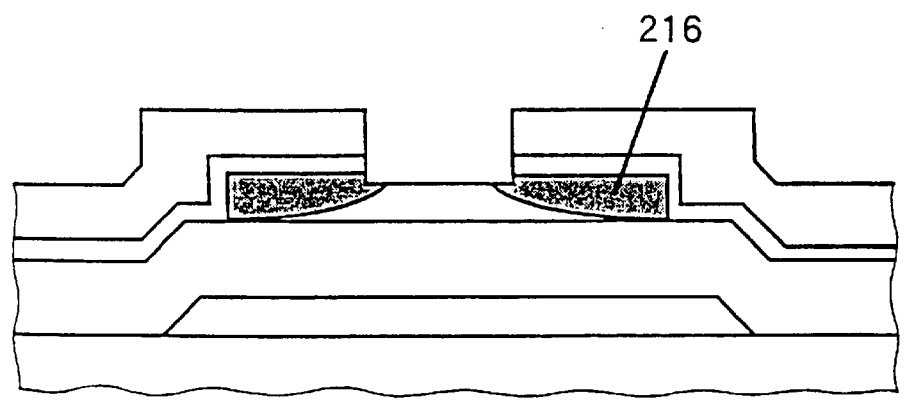

In the Embodiment 3, the structure of a CE-TFT of more stable TFT characteristics and a producing method thereof will be explained. Patterning of Cr film and Al film that are to be a source electrode and a drain electrode after forming a junction through ion implantation according to Embodiments 1 and 2 has been performed in that the source electrode and the drain electrode are made to cover an n-type impurity implantation region 206. This is shown in FIG. 5(a). This arrangement may cause the following drawbacks. FIG. 5(a) and FIG. 5(b) are a sectional, explanatory diagram for explaining a length of an impurity implantation region of a TFT according to another embodiment of the present invention, and 216 in FIG. 5(b) denotes an impurity implantation region. When length A, B of regions underneath the source electrode and drain electrode in which no impurities exist are equal as shown in FIG. 5(a), the TFT characteristic is symmetric. However, if the length A, B differ, the regions underneath the source electrode and the drain electrode in which no impurities exist are made to be a resistance, and since parasitic resistance values of the source electrode and the drain electrode differ, asymmetry appears in the characteristics. In order to solve this problem, it is necessary to regulate the length of the source electrode and the drain electrode by a length of the impurity implanting region. A producing method of a TFT of a structure in which the length of the source electrode and the drain electrode are regulated by the length of the impurity implanting region will now be explained. The same steps as those of Embodiments 1 and 2 are performed up to the process of ion implantation and forming an impurity layer. In forming a source electrode and a drain electrode, a two-layer structured conductive film of Al deposited on a Cr ground is formed by sputtering, and photolithography is performed as to make the impurity layer implanting region 216 exist underneath the source electrode and the drain electrode. Thereafter, the two-layer structured film is etched to obtain a desired CE-TFT. This is shown in FIG. 5(b). By employing this arrangement, no amorphous silicon layer of high resistance is formed underneath the source electrode and the drain electrode whereby the problem of asymmetry of the TFT characteristics is cleared. In this case, a curved portion of the impurity implanting region indicated by reference numeral 216 denotes the junction.

Embodiment 4

Figure 6A:
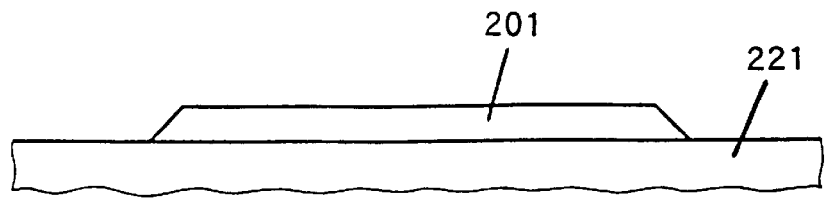
FIG. 6(a) to FIG. 6(c) are sectional, explanatory diagrams of a TFT according to another embodiment of the present invention.
Figure 6B:
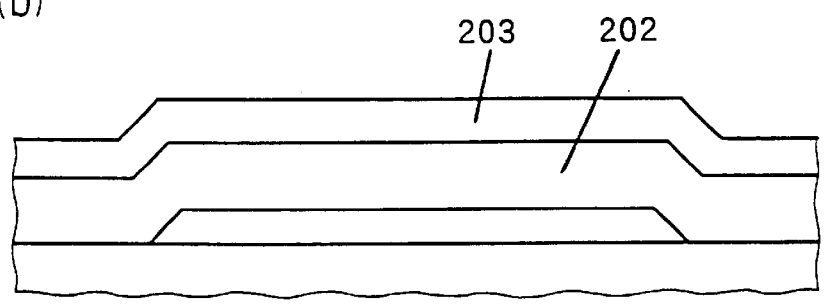
Figure 6C:
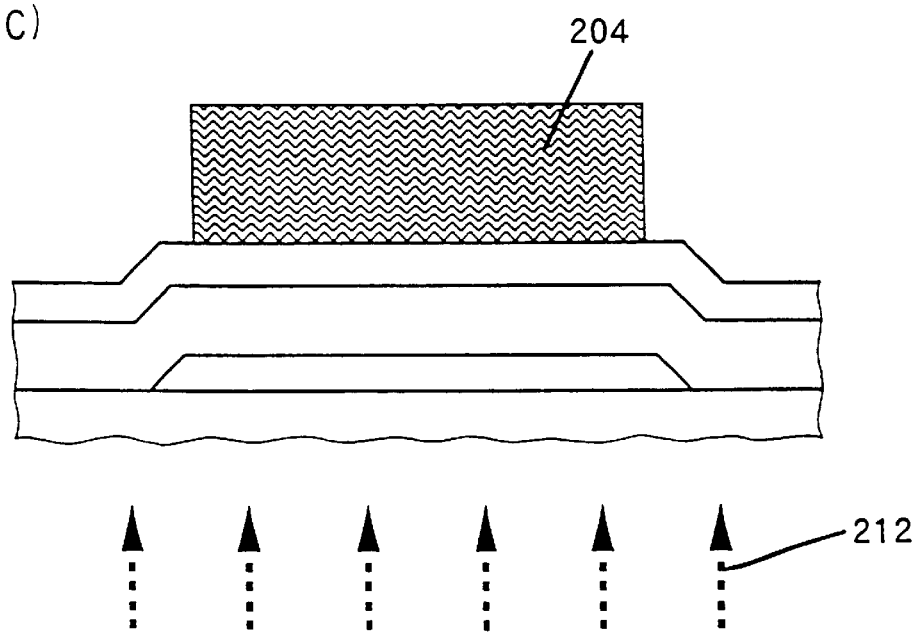
Figure 7:
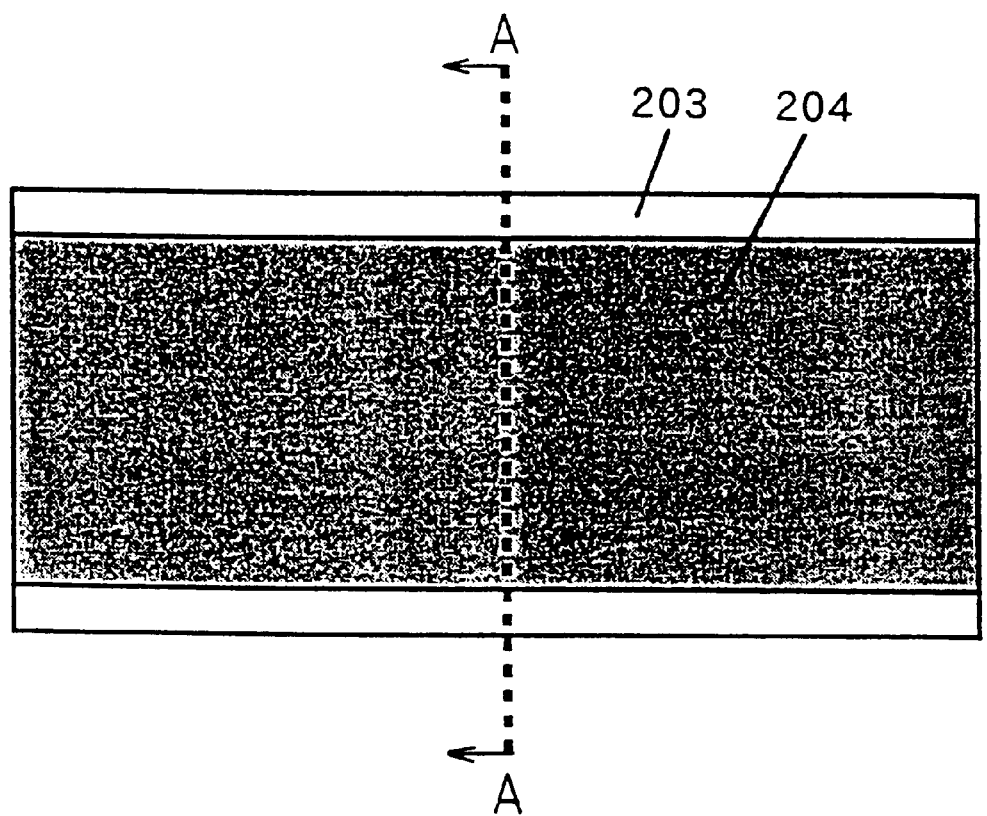
FIG. 7 is a plan, explanatory view of a pattern after developing according to another embodiment of the present invention.

In Embodiment 4, a method for making a small-sized TFT while employing a basic TFT structure as shown in embodiments 1 to 3 will be explained. The producing method thereof is shown in FIG. 6(a) to FIG. 6(c), FIG. 7, FIG. 8(a), FIG. 8(b) and FIG. 9(a) to FIG. 9(c). FIG. 6(a) to FIG. 6(c), FIG. 8(a), FIG. 8(b) and FIG. 9(a) to FIG. 9(c) are sectional, explanatory views showing a producing method of a TFT according to this embodiment, and FIG. 7 is an explanatory diagram of a pattern after developing by photolithography. In FIG. 6(a) to FIG. 6(c), 212 denotes exposure, and in FIG. 7, 226 an impurity implanting region.

First, Cr film, which is a metal of low resistance and of high melting point, is formed on an insulating substrate 221 made of glass or the like by spattering. Then, a pattern is formed by photolithography, and by forming a pattern of Cr film through etching, the gate electrode 201 is obtained (FIG. 6(a)). Next, an amorphous silicon layer (i-a-Si:H) is successively formed by plasma CVD as an intrinsic, that is, a non-doped semiconductor layer which is to be the gate insulating film 202 and the channel layer 203. The film thickness for the gate insulating film is approximately 400 nm and that of the intrinsic amorphous silicon layer approximately 100 nm (FIG. 6(b)). Next, a resist film is applied by photolithography. Then, light is irradiated from a rear side as shown by an arrow indicated by reference numeral 212 in FIG. 6(c) to perform exposure 212. A pattern after developing by exposure 212 from the rear side is shown in FIG.

Figure 8A:
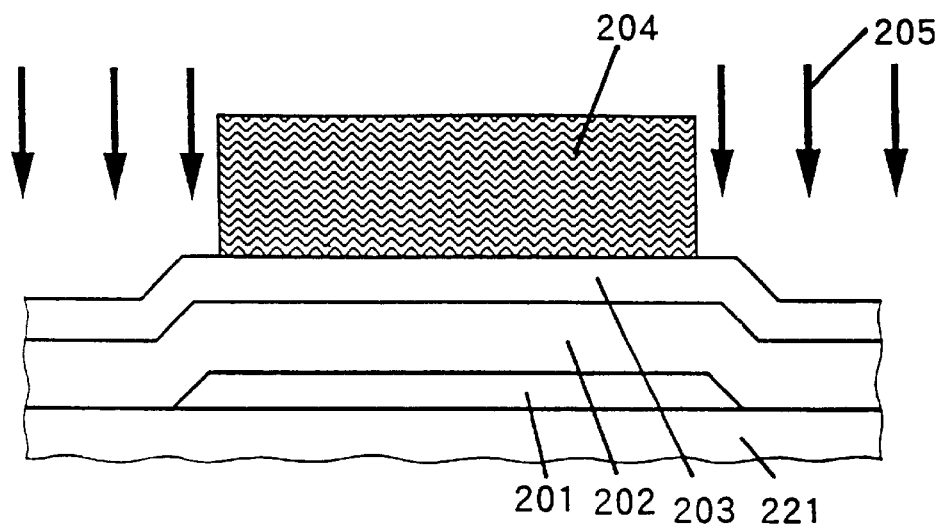
FIG. 8(a) and FIG. 8(b) are sectional, explanatory diagrams of a TFT according to another embodiment of the present invention.
Figure 8B:
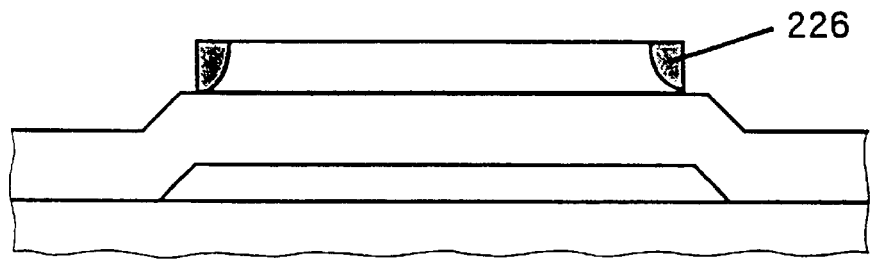
Figure 9A:
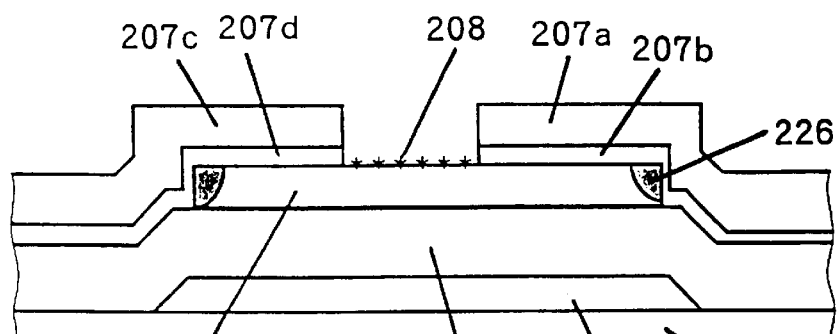
FIG. 9(a) and FIG. 9(c) are sectional, explanatory diagrams of a TFT according to another embodiment of the present invention.
Figure 9B:
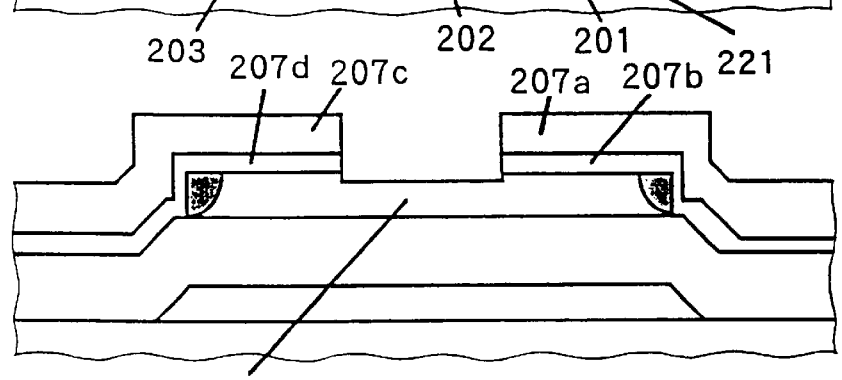
Figure 9C:
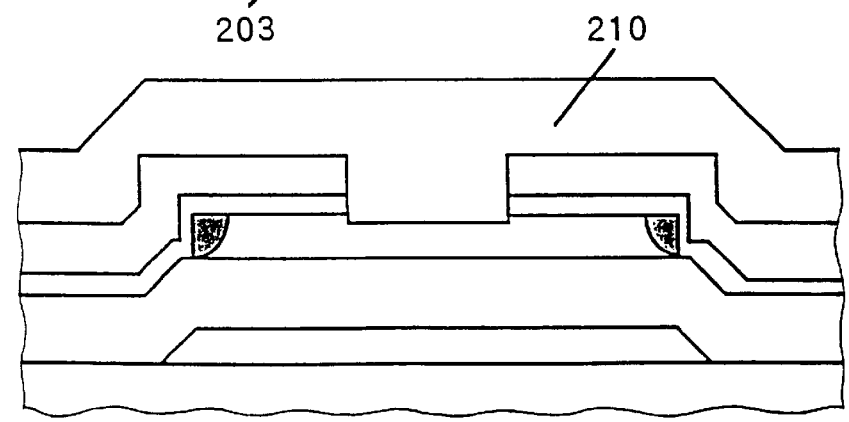

6(c), FIG. 8(a) and FIG. 8(b). FIG. 8(a) and FIG. 8(b) are plan, explanatory views of a pattern after developing, and FIG. 6(c) is a sectional, explanatory view of a CE-TFT along line A—A indicated in FIG. 8(a) and FIG. 8(b). As shown in these drawings, the formed pattern of the resist layer is a pattern that is more reduced than the gate line pattern. In this condition, implantation of phosphorus 5 into the entire surface is performed with the resist being a mask (FIG. 8(a)). The implantation energy and the amount of implantation is equal to those of the conditions as shown in Embodiment 1. Then, removal of resist is performed, and by forming a specified region, that is, a region onto which the TFT is formed in a form of an island, an n-type impurity implanting region 226 is formed (FIG. 8(b)). After removal of resist, Cr film and Al film that are to be the source electrode and the drain electrode are deposited by sputtering. An electrode pattern is formed by photolithography, and etching of the Cr film and the Al film is performed in FIG. 9(a). When performing this etching, chrome silicide (CrSix), though in a minute amount, is formed by a reaction of Cr and amorphous silicon which may cause a short-circuit between the source and the drain so that removal of CrSix is performed by further performing dry etching (FIG. 9(b)). Since the selective ratio of the CrSix and the amorphous silicon film is sufficient in this dry etching, the amorphous silicon layer is not largely etched and does not largely influence the filmed amorphous silicon layer. Further, a nitride film that is to be a passivation film 210 is deposited by plasma CVD to a thickness of approximately 500 nm to obtain CE-TFT (FIG. 9(c)). With this method, the width of gate line in the line region in which the TFT is formed is reduced, whereby an improvement in aperture ratio and a decrease in parasitic capacitance of the TFT itself may be achieved.

Embodiment 5

The basic structure of the TFT, TFT array substrate, and the liquid crystal display according to the present invention are equal to those of the example of the prior art. That is, the semiconductor TFT according to the present invention is comprised of an insulating layer onto which there are successively formed, from the bottom side, a gate line, a gate insulating film on the gate line, an i-layer which is an intrinsic semiconductor layer on the gate insulating film, a source electrode on a source region of the i-layer, and a drain electrode on a drain region of the i-layer in this order, and the source electrode portion and the drain electrode portion of the i-layer is implanted with impurities to be changed to n-layer. The n-layer may be formed by either changing the entire area from a lower surface of the source electrode to an upper surface of the gate insulating film to n-layer or by leaving a slight i-layer portion by changing the area from the lower surface of the source electrode to a proximity of the upper surface of the gate insulating film, and thus, almost the entire area to n-layer.

Further, the semiconductor TFT array substrate according to the present invention is comprised of a transparent insulating substrate, a TFT formed on this transparent insulating substrate, various lines and electrodes. Out of these, the various lines and electrodes indicate a plurality of gate lines, a plurality of source lines, a pixel electrode or a storage capacitance electrode line, etc. The plurality of gate lines are arranged on the transparent insulating substrate as to be parallel to each other at equal intervals. The plurality of source lines cross with each of the plurality of drain lines and are arranged to be parallel to each other at equal intervals. The thin film transistor is arranged in a form of an array as a whole, and each of the crossing portions of the gate line and the source line is provided with n-layer obtained by implanting impurities to the source region portion and drain region portion of the i-layer. The pixel electrode is of transparent conductive film and are connected to drain electrode of the TFT. The storage capacitance electrode line is arranged in that an insulating film is interposed between the storage capacitance electrode line and the pixel electrode, and the storage capacitance by this insulating film is formed between the storage capacitance electrode line and the pixel electrode.

Further, the liquid crystal display according to the present invention is arranged in that a display material such as liquid crystal is interposed and held between two substrates, namely the above-described semiconductor TFT array substrate and an opposing substrate, and each pixel of the display material is selectively impressed with a voltage. There are arranged on the opposing substrate an opposing electrode, a color filter and a black matrix or the like.

The arrangement of a TFT according to a fifth embodiment of the present invention will now be explained along with a producing method thereof.

FIG. 10(a), FIG. 10(b), FIG. 11(a) and FIG. 11(b) are sectional, explanatory views showing an arrangement of a TFT according to embodiment 1 of the present invention. Each element that make up the TFT in FIG. 10(a), FIG. 10(b), FIG. 11(a) and FIG. 11(b) are named as the elements as explained in the prior art example. That is, in FIG. 10(a), FIG. 10(b), FIG. 11(a) and FIG. 11(b), Reference character A denotes ion implantation, and portions equal to each of the portions as shown in FIG. 24, FIG. 25, FIG. 26(a), FIG. 26(b), FIG. 27(a), FIG. 27(b), FIG. 28(a) to FIG. 28(f) and FIG. 29(a) to FIG. 29(d), which show an example of a prior art, are indicated by the same reference numerals and explanations thereof will be omitted. In FIG. 10(a), FIG. 10(b), FIG. 11(a) and FIG. 11(b), the n-layer 5 underlying the drain electrode 7 is arranged to be formed up to an interface with the gate insulating film or up to an extreme proximity thereof (in FIG. 10(a), it is formed up to the interface), and the structure of the n-layer provided as to be underlying the source electrode 8 is also equal to that of the side of the drain electrode. The n-layer portions of the drain electrode and the source electrode are separated by an i-layer 4.

Figure 10A:
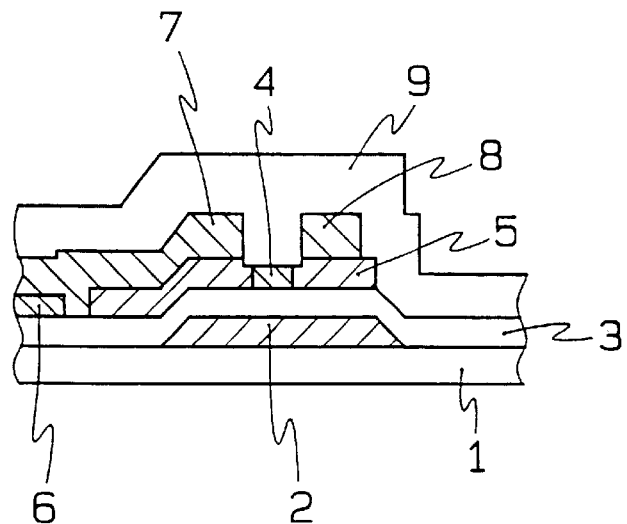
FIG. 10(a) and FIG. 10(b) are sectional, explanatory diagrams of a TFT according to an embodiment of the present invention.
Figure 10B:
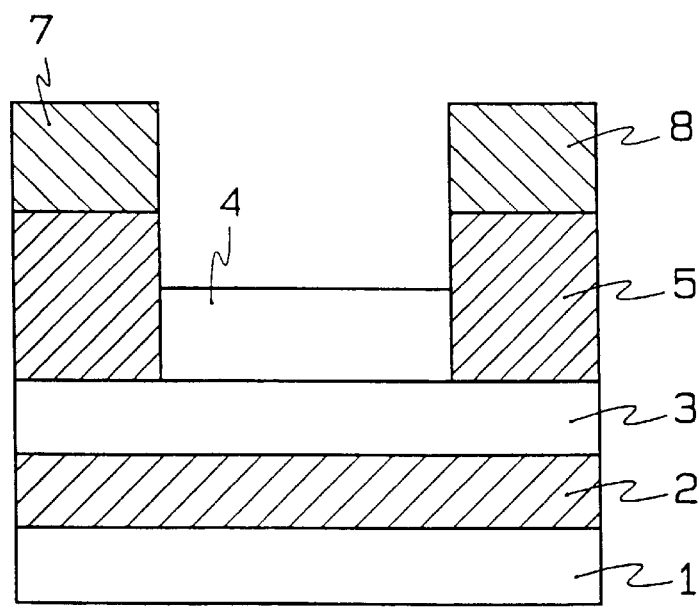
Figure 11A:
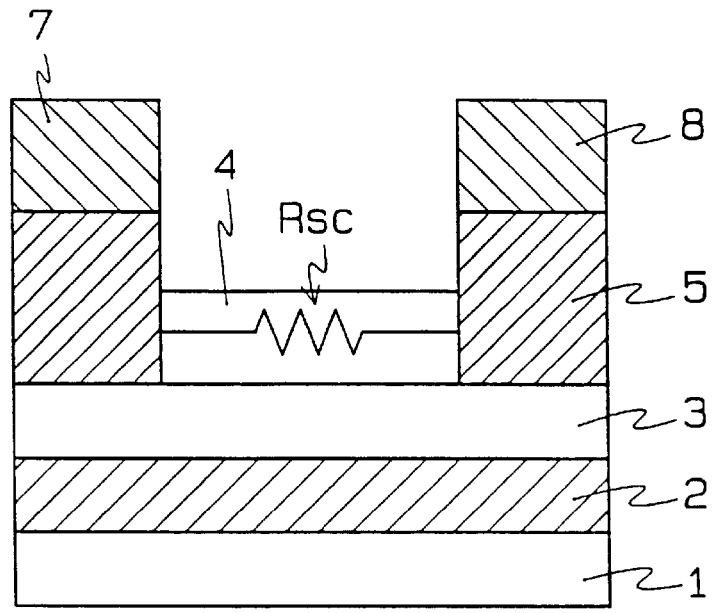
FIG. 11(a) and FIG. 11(b) are sectional, explanatory diagrams of a TFT according to an embodiment of the present invention.
Figure 11B:
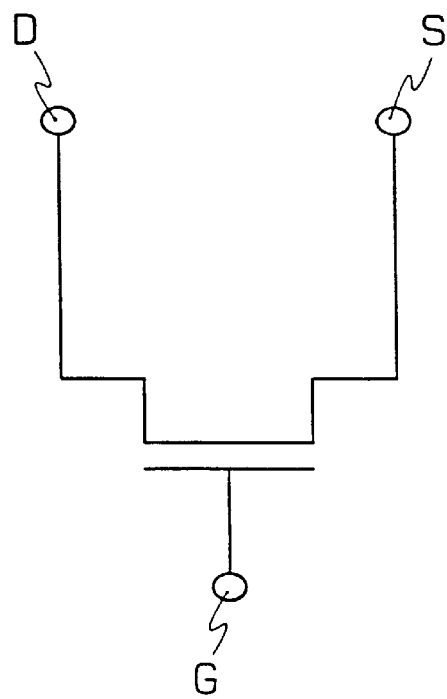

FIG. 10(b) is a diagram showing the structure in the proximity of the channel region as shown in FIG. 10(a) in a typical manner, and FIG. 11(a) is a diagram showing separation of ON resistance of the TFT into components of each element portion and the Rsc among the ON resistance is shown to be with the structure of the TFT, as it has been explained for the prior art. As shown in FIG. 11(a), since the semiconductor layer underlying the source electrode 8 and underlying the drain electrode 7 has been changed into n-layer, the resistance Rss and Rsd are sufficiently small compared to resistance Rsc so that they may be ignored, and only the Rsc needs to be assigned as an ON resistance of the TFT. FIG. 11(b) shows an equivalent circuit of a transistor, similarly to the prior art.

The producing method of a TFT according to the present embodiment will now be explained with reference to FIG. 12(a) to FIG. 12(e), FIG. 13(a) to FIG. 13(d) and FIG. 14(a) to FIG. 14(d). FIG. 12(a) to FIG. 12(e), FIG. 13(a) to FIG. 13(d) and FIG. 14(a) to FIG. 14(d) are a sectional, explanatory diagram showing each process of the manufacturing method of a TFT according to Embodiment 1. In FIG. 12(a) to FIG. 12(e), FIG. 13(a) to FIG. 13(d) and FIG. 14(a) to FIG. 14(*d*), portions that are equal to those of FIG. 10(*a*), FIG. 10(*b*), FIG. 11(*a*) and FIG. 11(*b*) are indicated by the same reference numerals and 21, 22, 23, 24 and 25 denote a resist, respectively.

FIG. 12(*a*) and FIG. 12(*b*) are equal to the prior manufacturing method. That is, a first metal thin film is formed on an insulating substrate, a resist 21 is formed and patterned, and the first metal thin film is etched to obtain a gate electrode (gate line). In FIG. 12(*c*), a gate insulating film 3 and an i-layer are successively formed to cover an overlying layer of the gate electrode 2 through plasma CVD method, and as shown in FIG. 12(*d*), a resist 22 is developed and formed to cover the source region, drain region, and the channel region, and is patterned by etching to form a pattern of the i-layer. Thereafter, the resist 22 is removed as shown in FIG. 12(*e*), and as shown in FIG. 13(*a*), a resist 23 is developed and formed on the channel region on the i-layer of the TFT, and ion implantation of impurities is performed, whereby n-layer 4 is formed in the source region and the drain region of the i-layer as shown in FIG. 13(*b*). The impurity that is to be ion implanted may be freely chosen as long as a condition is met in that n-type semiconductor can be formed thereby, which may be phosphorus (P). The ion implantation method is performed under the condition that a plasma is raised from a gas of phosphine (PH3) and phosphorous (P) is ion implanted. Unless explained other rise, the ion implantation method is performed in this manner. After the resist has been removed, an ITO thin film is formed as shown in FIG. 13(*c*), and after developing resist 24, the ITO thin film is etched, the pixel electrode 6 formed, and the resist is removed as shown in FIG. 13(*d*). Further, after forming a second metal thin film covering the i-layer and n-layer as shown in FIG. 14(*a*), resist 25 is developed and formed, a source region and drain region of the second thin metal etched to form a drain electrode 7 and a source electrode 8, and thereafter, silicide compounds of the channel region (not shown) removed as shown in FIG. 14(*b*). The resist is then removed, and a TFT is formed as shown in FIG. 14(*c*) to form a DC cut film 9 as an insulating film as shown in FIG. 14(*d*).

In this manner, a display region is formed by arranging a TFT, gate line, source line and other common line onto a glass substrate in a form of an array, and an input terminal or auxiliary line is arranged in the periphery of the display region to obtain a TFT array substrate. Methods for forming these lines or terminal are equal to those of the prior art. In order to make the respective functions work, conductive films or insulating films are arranged when required. The opposing substrate is provided thereon with opposing electrodes, a color filter and a black matrix. A driving IC for driving the TFT is additionally provided at a desired position of the TFT array substrate.

After manufacturing a TFT array substrate and an opposing substrate, both substrates are stuck together at their circumference with a desired space formed therebetween so that a liquid crystal material may be implanted between the two substrates, a liquid crystal material is then implanted between the two substrates to obtain a liquid crystal display.

Embodiment 6

FIG. 15(*a*) to FIG. 15(*e*) show a structure of a TFT according to Embodiment 6 and a producing method thereof. FIG. 15(*a*) to FIG. 15(*e*) are a sectional, explanatory view showing each of the processes of a manufacturing method of a TFT according to embodiment 6 of the present invention. In the drawings, 31 and 32 denote a resist, and the remaining reference numerals are used in common with those of FIG. 10(*a*), FIG. 10(*b*), FIG. 11(*a*) and FIG. 11(*b*).

While in the Embodiment 5 as shown in FIG. 12(*a*) to FIG. 12(*e*), FIG. 13(*a*) to FIG. 13(*d*) and FIG. 14(*a*) to FIG. 14(*d*), ion implantation of impurities has been performed after forming a pattern of the semiconductor layer, ion implantation of impurities may also be performed by a manufacturing flow as shown in FIG. 15(*a*) and FIG. 15(*b*). The same steps are performed as in embodiment 1 except for changing the manufacturing flow in a manner as will be now explained. After forming a gate insulating film 3 and an i-layer 4 as an intrinsic semiconductor film as shown in FIG. 15(*a*), a pattern of the resist 31 that may mask a channel region on the i-layer against ion implantation is developed and formed thereon as shown in FIG. 15(*b*), and by ion implanting impurities in regions of the i-layer other than the channel region, the region of the i-layer which has been ion implanted is changed to n-type semiconductor thin film. The resist 31 is then removed and the n-type semiconductor thin film, that is, the n-layer is formed as shown in FIG. 15(*c*). Next, a source region and drain region of the n-layer and the channel region of the i-layer are patterned with these regions being a semiconductor region portion as shown in FIG. 15(*d*). Thereafter, the n-layer of regions other than the semiconductor region portion is removed so that the source region and the drain region are changed to be of a n-layer and the channel region of an i-layer. The remaining steps of the manufacturing flow after FIG. 15(*e*) are equal to those of Embodiment 5.

Embodiment 7

Figure 16A:
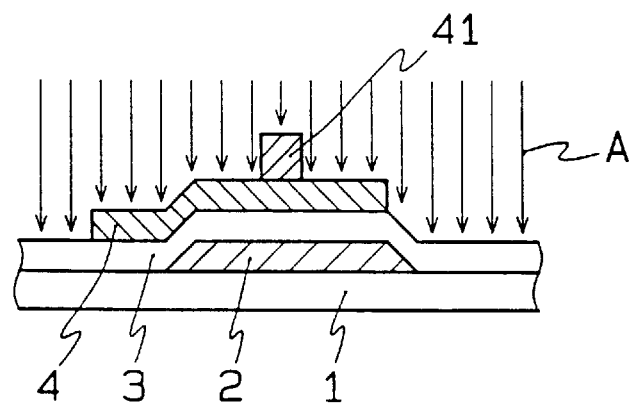
FIG. 16(a) to FIG. 16(c) are a sectional, explanatory diagram showing each successive process of a manufacturing flow of the TFT according to another embodiment of the present invention.
Figure 16B:
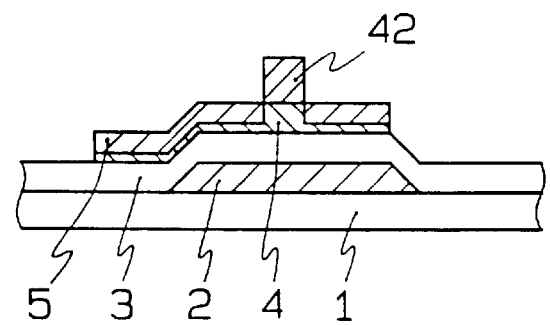
Figure 16C:
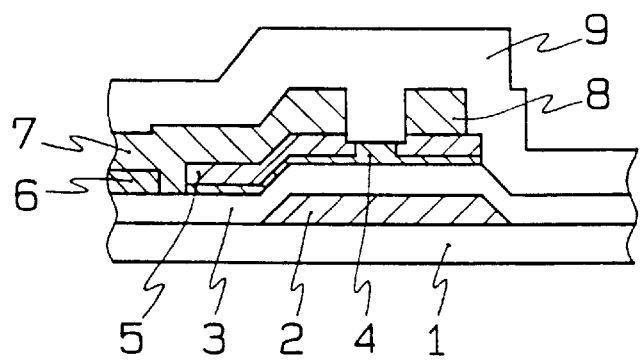

FIG. 16(*a*) to FIG. 16(*c*) show a structure of a TFT according to Embodiment 7 and a producing method thereof. FIG. 16(*a*) to FIG. 16(*c*) are a sectional, explanatory view showing each of the processes of a manufacturing method of a TFT according to Embodiment 7 of the present invention. In FIG. 16(*a*) to FIG. 16(*c*), 41 and 42 denote a resist, and the remaining reference numerals are used in common with those of FIG. 10(*a*), FIG. 10(*b*), FIG. 11(*a*) and FIG. 11(*b*).

While the entire semiconductor layer except for the channel region has been changed to a n-layer by ion implantation of a n-type impurity as shown in FIG. 11(*a*) and FIG. 11(*b*), the i-layer as shown in FIG. 16(*b*) is made to be of n-type (n-layer) up to a proximity of an interface with a gate insulating film by adjusting the implantation energy at the time of ion implantation of impurities as shown in FIG. 16(*a*) or by adjusting the film thickness of the i-layer. That is, the area between a lower surface of a source electrode and a proximity of an upper surface of the gate insulating film is changed to be of n-type. Therefore, an i-layer of extremely thin film thickness remains on the upper surface of the gate insulating film. Finally, a TFT arrangement as shown in FIG. 16(*c*) can be obtained. The same steps are taken as in embodiment 6 except for the step of forming a n-layer up to a proximity of the upper surface of the gate insulating film.

Embodiment 8

FIG. 17(*a*) to FIG. 17(*d*) show a structure of a TFT according to Embodiment 8 and a producing method thereof. FIG. 17(*a*) to FIG. 17(*d*) are a sectional, explanatory view showing each of the processes of a manufacturing method of a TFT according to Embodiment 8 of the present invention. In FIG. 17(*a*) to FIG. 17(*d*), 51 and 52 denote a resist, and the remaining reference numerals are used in common with those of FIG. 10(*a*), FIG. 10(*b*), FIG. 11(*a*) and FIG. 11(*b*).

Figure 17A:
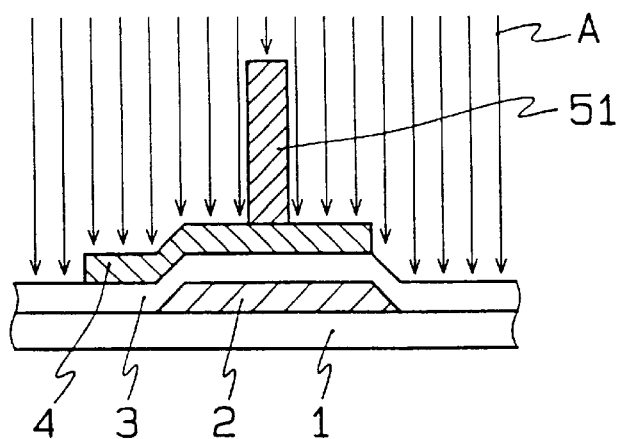
FIG. 17(a) to FIG. 17(d) are a sectional, explanatory diagram showing each successive process of a manufacturing flow of the TFT according to another embodiment of the present invention.
Figure 17B:
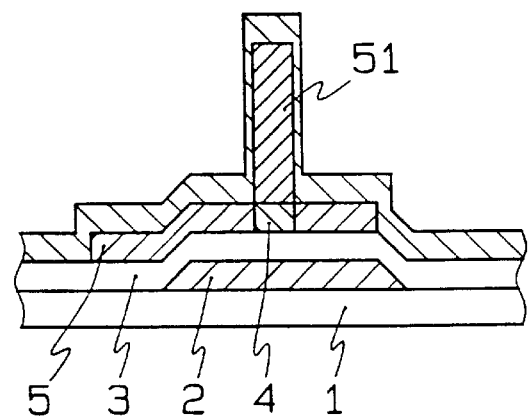
Figure 17C:
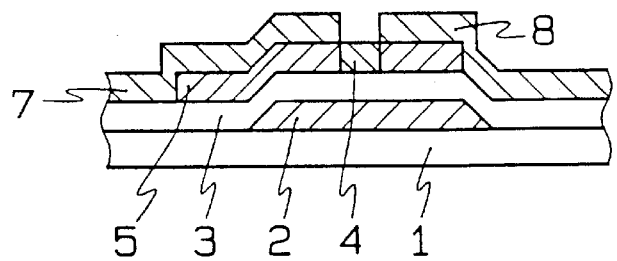
Figure 17D:
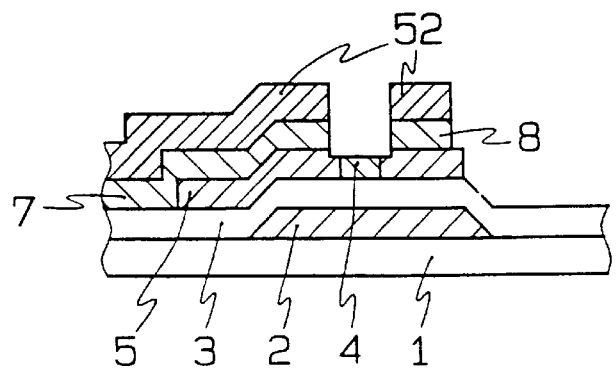

While the source electrode and drain electrode have been formed after removing the resist after ion implantation of impurities in Embodiment 5 as shown in FIG. 11(a) and FIG. 11(b), a second metal thin film is formed with resist 51 remaining after ion implantation, and by utilizing tie face that scarcely no metal thin film is formed on the side surface of the resist 51, the metal thin film of the channel region including the resist is removed by lift off as shown in FIG. 17(a) and FIG. 17(b). Further, as shown in FIG. 17(d), the resist 52 is developed and the metal thin film is etched in order to form a source electrode and a drain electrode. Since the metal thin film and the channel region do not directly contact with each other in this method, the i-layer at the side of the back channel needs scarcely be etched. The same steps are performed as in Embodiment 6 except for the step of forming a metal thin film with the resist remaining after ion implantation and removing the metal thin film of the channel region by lift off.

Embodiment 9

FIG. 18(a) to FIG. 18(e) and FIG. 19(a) to FIG. 19(d) show a structure of a TFT according to Embodiment 9 and a producing method thereof. FIG. 18(a) to FIG. 18(e) and FIG. 19(a) and FIG. 19(d) are a sectional, explanatory view showing each of the processes of a manufacturing method of a TFT according to Embodiment 5 of the present invention. In FIG. 18(a) to FIG. 18(e) and FIG. 19(a) to FIG. 19(d), 61, 62, 63 and 64 denote a resist, and the remaining reference numerals are used in common with those of FIG. 10(a), FIG. 10(b), FIG. 11(a) and FIG. 11(b).

Figure 12A:
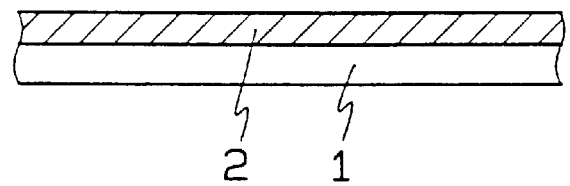
FIG. 12(a) to FIG. 12(e) are a sectional, explanatory diagram showing each successive process of a manufacturing flow of the TFT according to the embodiment of the present invention as shown in FIG. 10(a) and FIG. 10(b), FIG. 13(a) to FIG. 13(d) are a sectional, explanatory diagram showing each successive process of a manufacturing flow of the TFT according to the embodiment of the present invention as shown in FIG. 10(a) and FIG. 10(b), FIG. 14(a) to FIG. 14(d) are a sectional, explanatory diagram showing each successive process of a manufacturing flow of the TFT according to the embodiment of the present invention as shown in FIG. 10(a) and FIG. 10(b), FIG. 15(a) to FIG. 15(e) are a sectional, explanatory diagram showing each successive process of a manufacturing flow of the TFT according to another embodiment of the present invention.
Figure 12B:
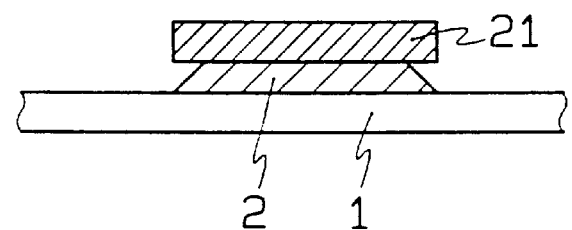
Figure 12C:
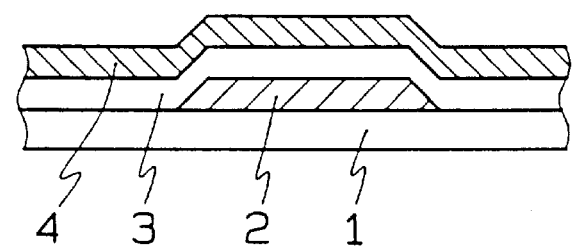
Figure 12D:
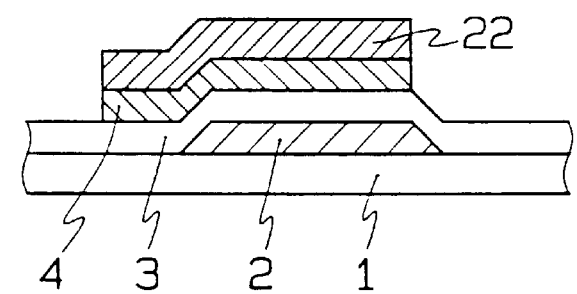
Figure 12E:
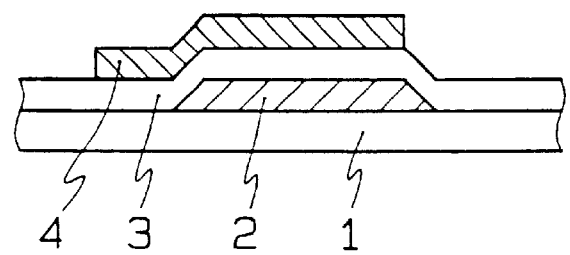
Figure 13A:
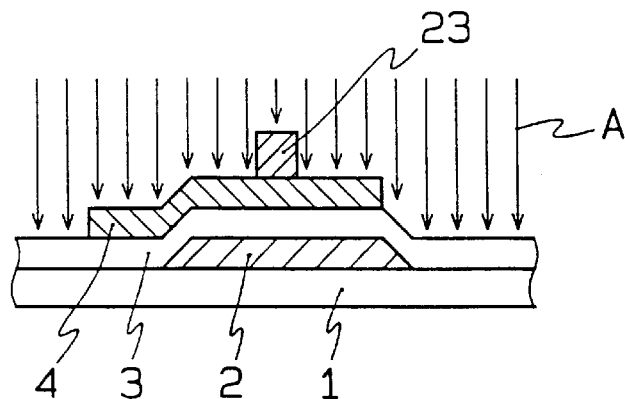
Figure 13B:
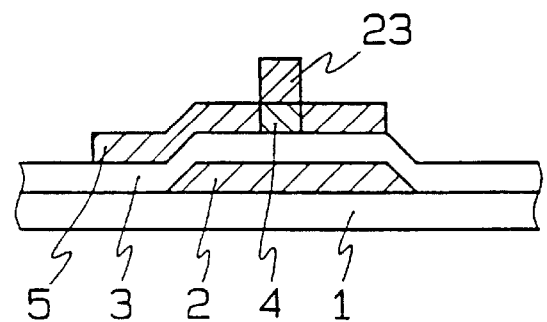
Figure 13C:
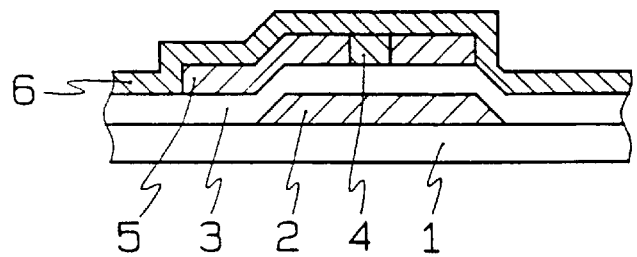
Figure 13D:
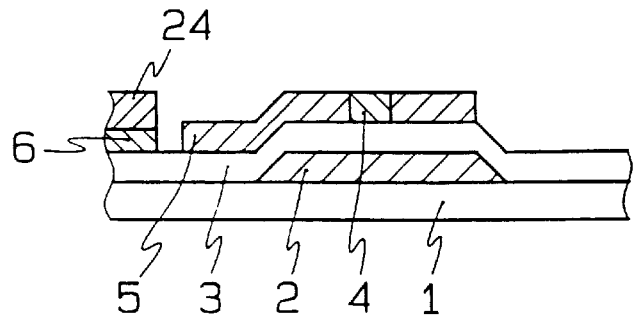
Figure 14A:
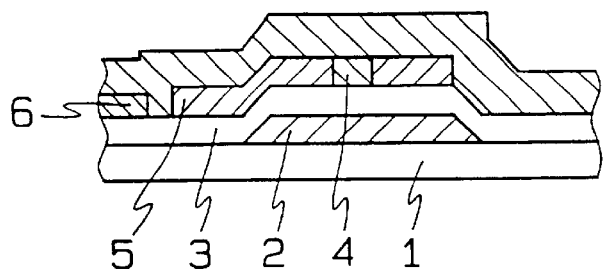
Figure 14B:
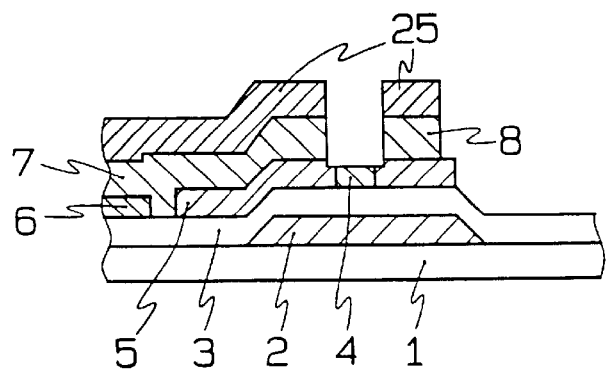
Figure 14C:
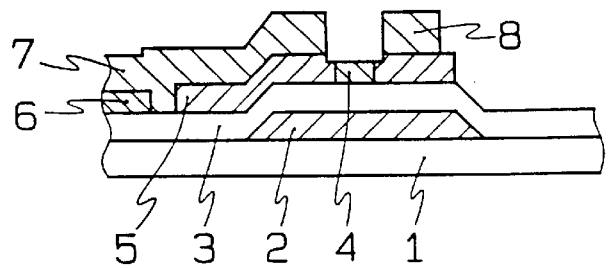
Figure 14D:
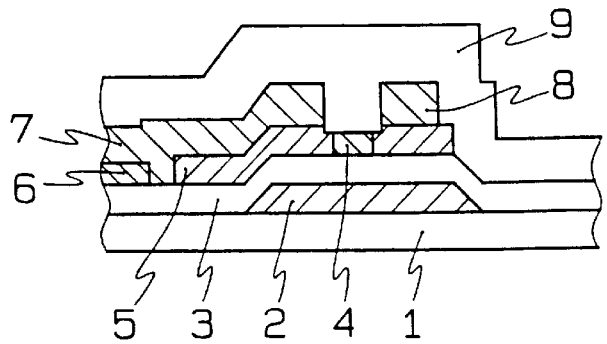
Figure 15A:
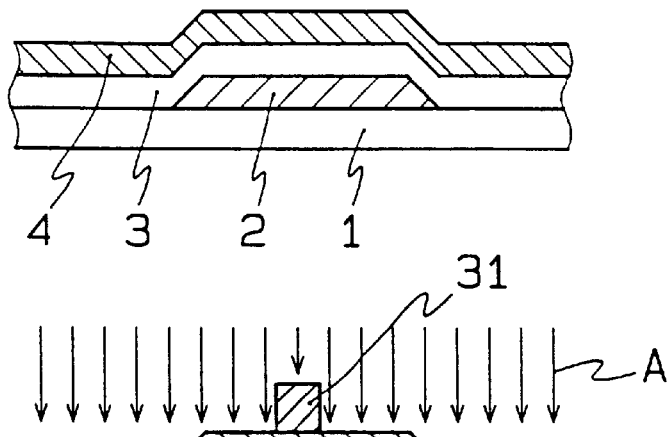
Figure 15B:
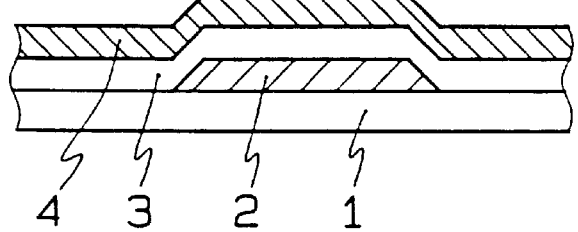
Figure 15C:
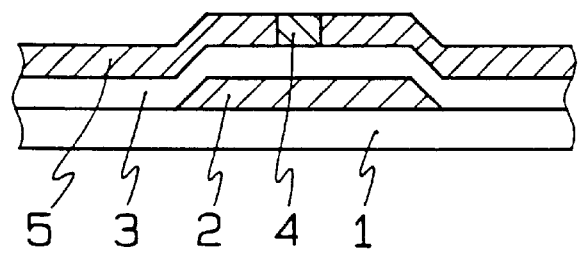
Figure 15D:
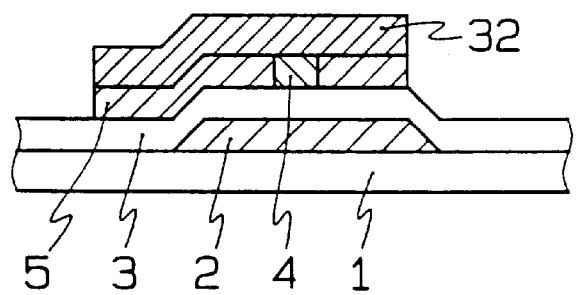
Figure 15E:
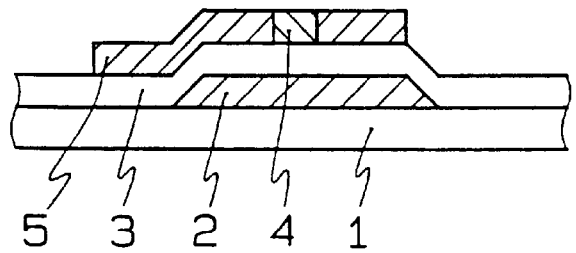
Figure 18A:
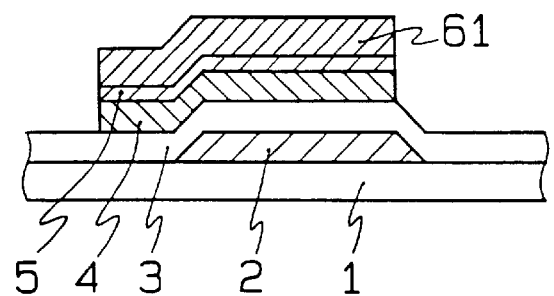
FIG. 18(a) to FIG. 18(e) are a sectional, explanatory diagram showing each successive process of a manufacturing flow of the TFT according to another embodiment of the present invention.
Figure 18B:
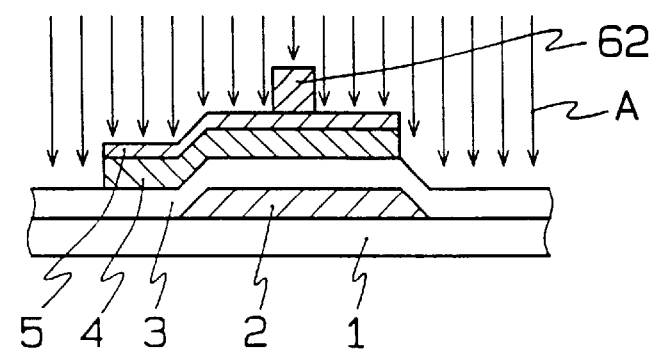
Figure 18C:
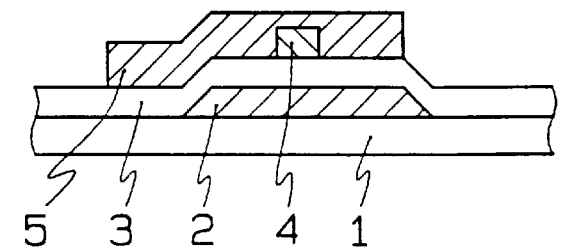
Figure 18D:
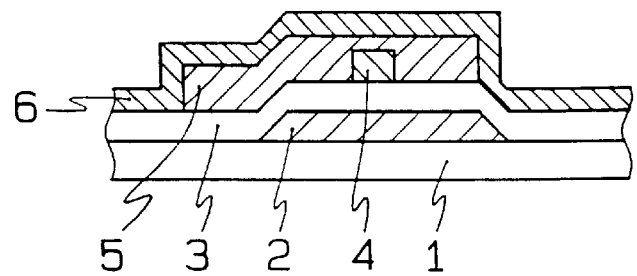
Figure 18E:
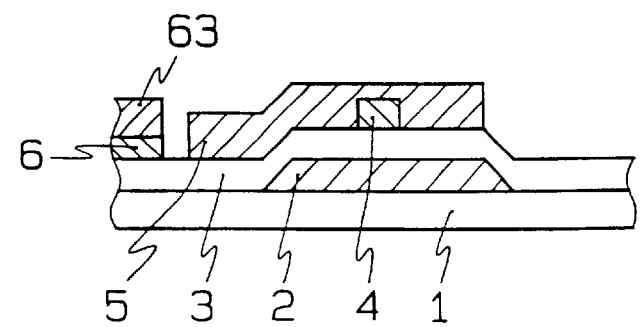
Figure 19A:
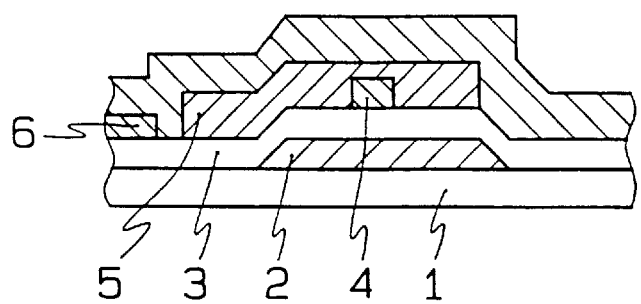
FIG. 19(a) to FIG. 19(d) are a sectional, explanatory diagram showing each successive process of a manufacturing flow of the TFT according to another embodiment of the present invention.
Figure 19B:
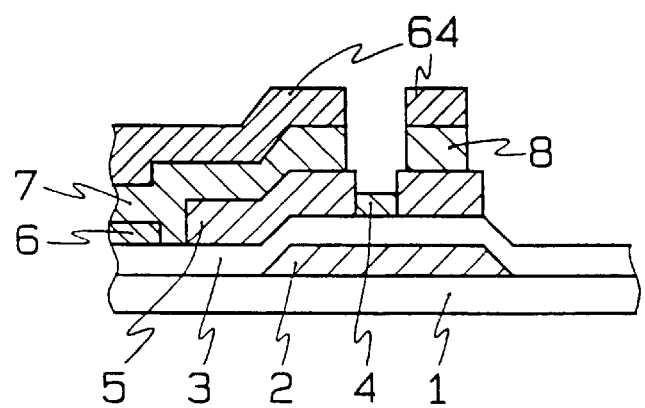
Figure 19C:
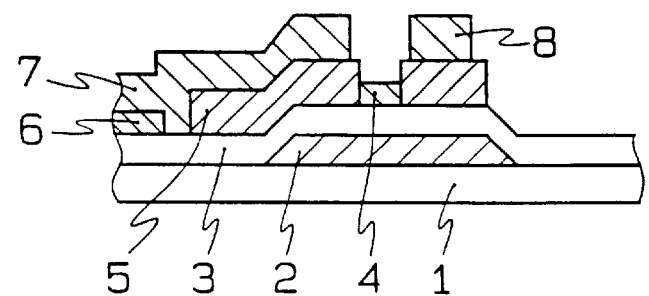
Figure 19D:
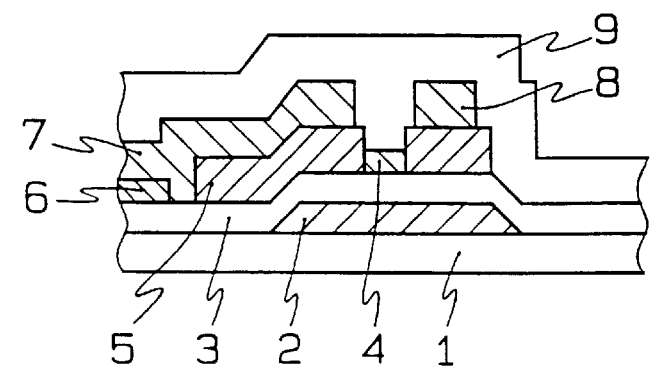

While ion implantation has been performed in Embodiment 5 after a pattern of the i-layer has been formed as shown in FIG. 12(e) and a resist has been developed in a channel portion as shown in FIG. 13(a), it may be of an arrangement in that a n-layer 5 of n-type semiconductor thin film is formed on an i-layer 4, a pattern of resist 61 is developed and created, a pattern extending over a source region, drain region and channel region is formed by etching as shown in FIG. 18(a), region 62 is developed and created in the channel region on the n-layer as shown in FIG. 18(b), ion implantation of impurities is performed through the n-layer, and the resist 62 and the n-layer are removed thereafter. In this arrangement, since the n-layer is formed in the channel region on the surface at the side of the back channel as shown in FIG. 18(c), the manufacturing flow thereafter performs the same processes as in the conventional manufacturing flow as previously described (FIG. 18(c), FIG. 18(d), FIG. 19(a), FIG. 19(b), FIG. 19(c) and FIG. 19(d)). Therefore, the entire n-layer in the channel region at the side of the back channel needs to be removed, whereby the uniformity of TFT characteristics in the substrate surface is not so good; however, since the i-layer underlying the drain electrode and underlying the source electrode of the TFT can be changed to a n-type, resistance Rsd and Rss can be decreased at each electrode portion.

Embodiment 10

Figure 20A:
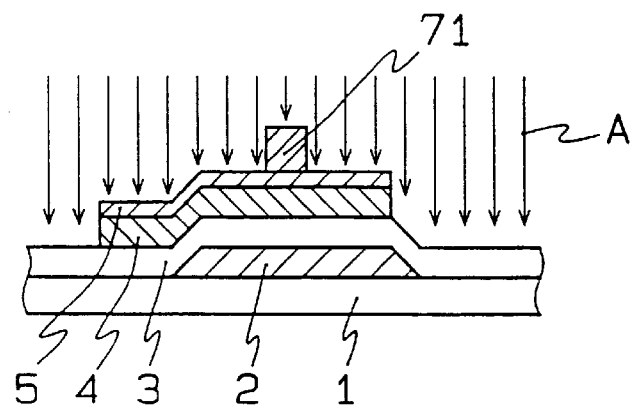
FIG. 20(a) to FIG. 20(c) are a sectional, explanatory diagram showing each successive process of a manufacturing flow of the TFT according to another embodiment of the present invention.
Figure 20B:
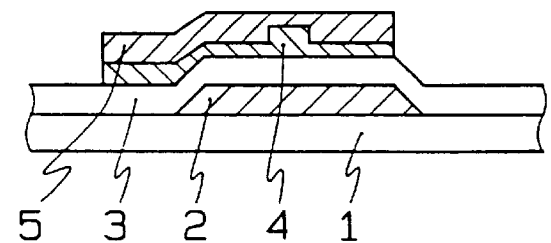
Figure 20C:
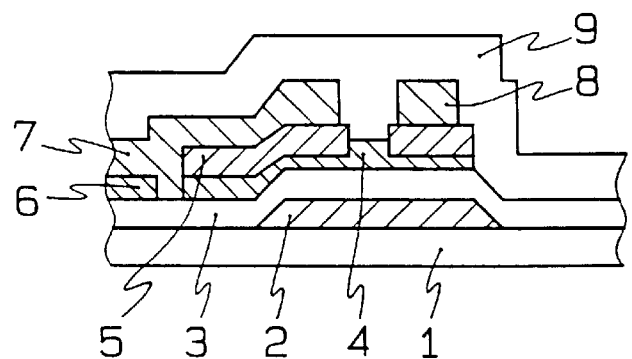
Figure 21A:
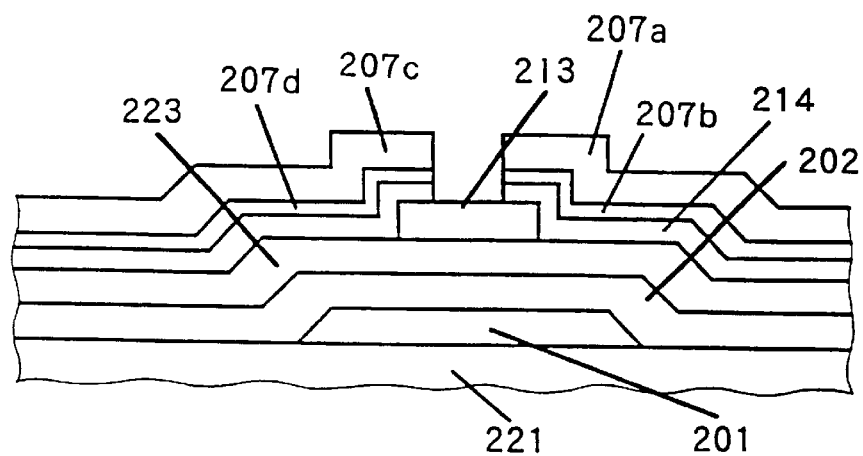
FIG. 21(a) and FIG. 21(b) are sectional, explanatory diagrams of a conventional etching stopper type TFT.
Figure 21B:
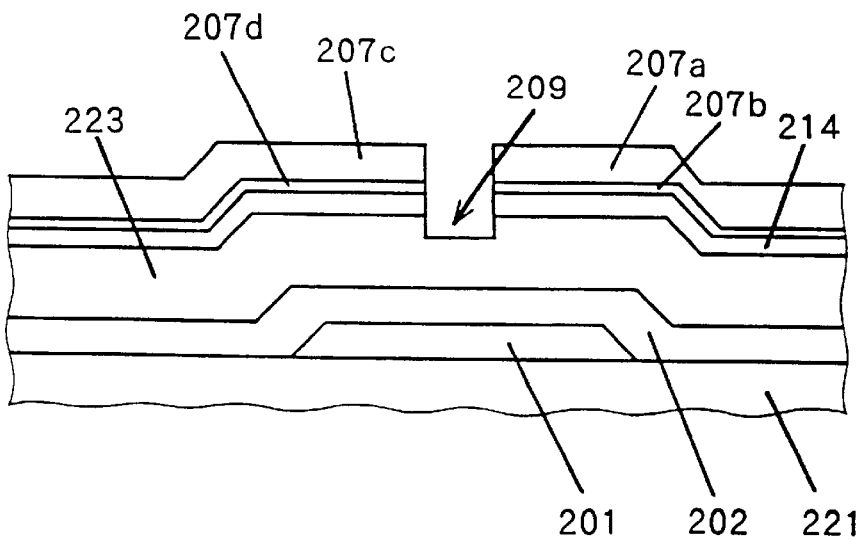
Figure 22A:
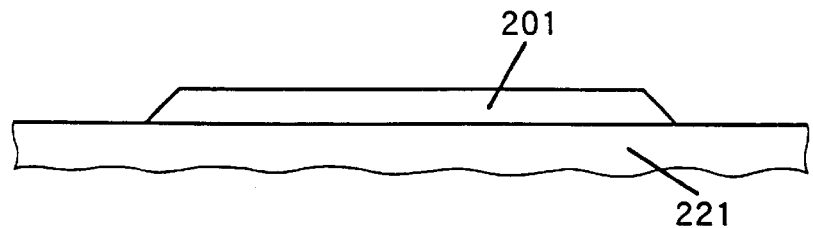
FIG. 22(a) to FIG. 22(c) are sectional, explanatory diagrams of a conventional channel etch type TFT.
Figure 22B:
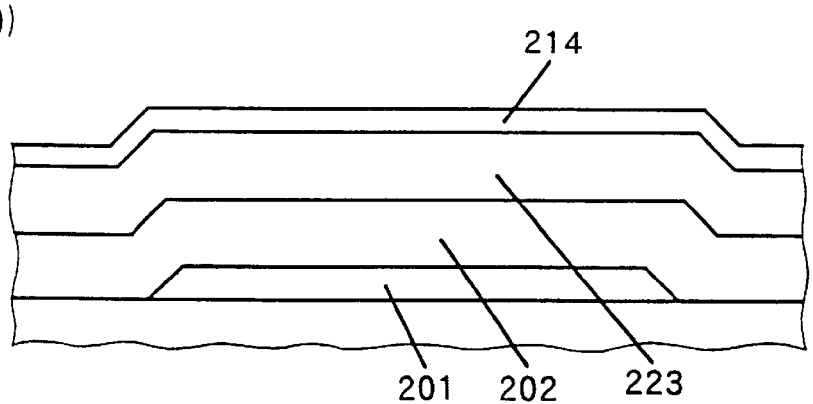
Figure 22C:
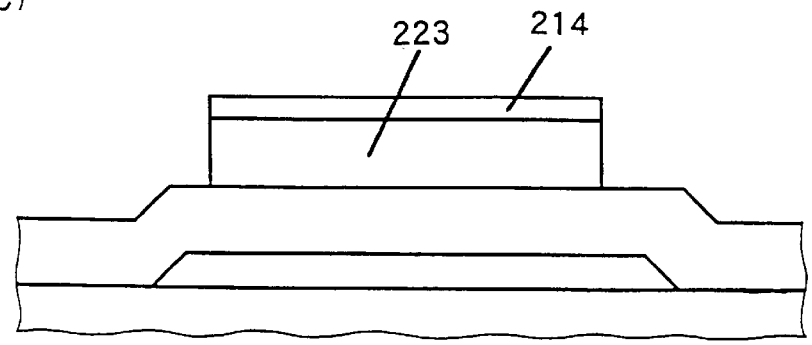
Figure 23A:
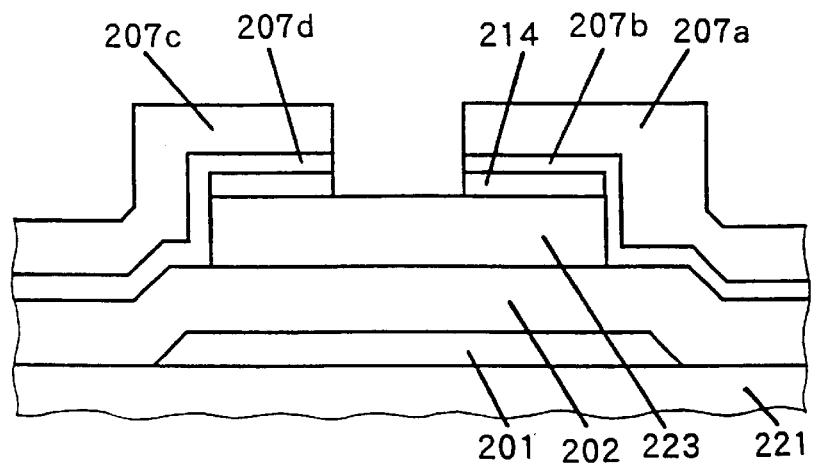
FIG. 23(a) to FIG. 23(c) are sectional, explanatory diagrams of a conventional channel etch type TFT.
Figure 23B:
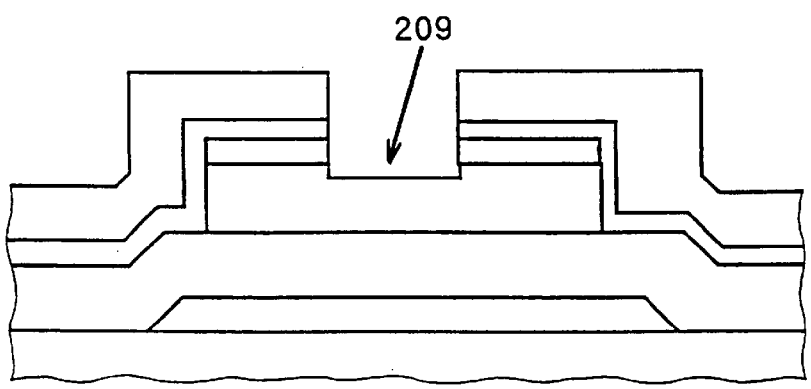
Figure 23C:
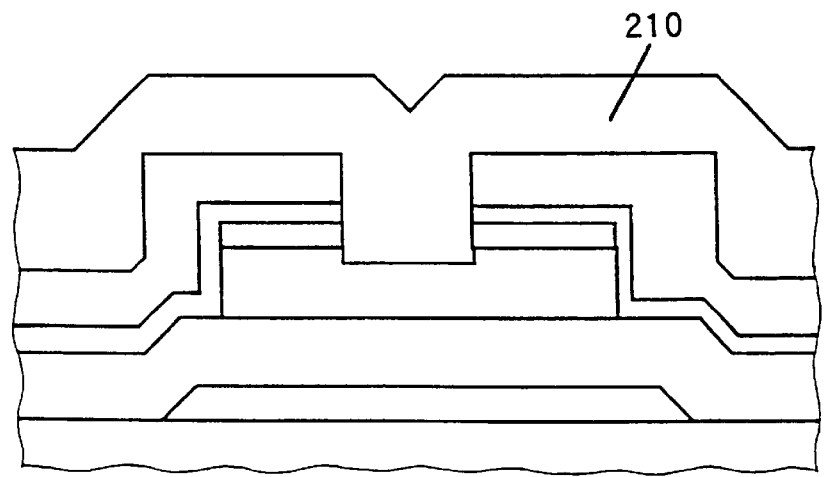
Figure 24:
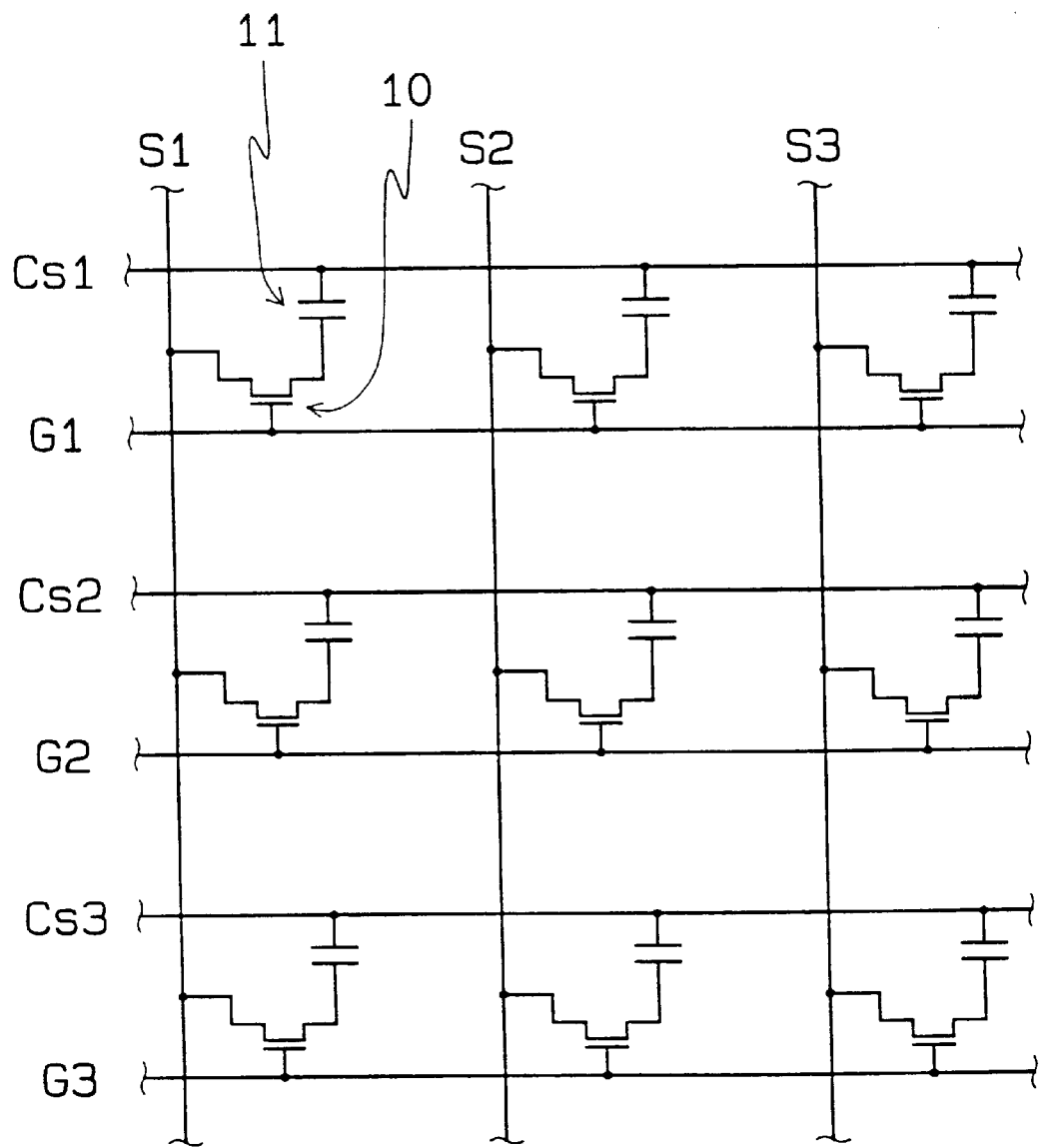
FIG. 24 is a circuit diagram showing an example of an equivalent circuit related to a TFT array substrate in a conventional TFT-LCD.
Figure 25:
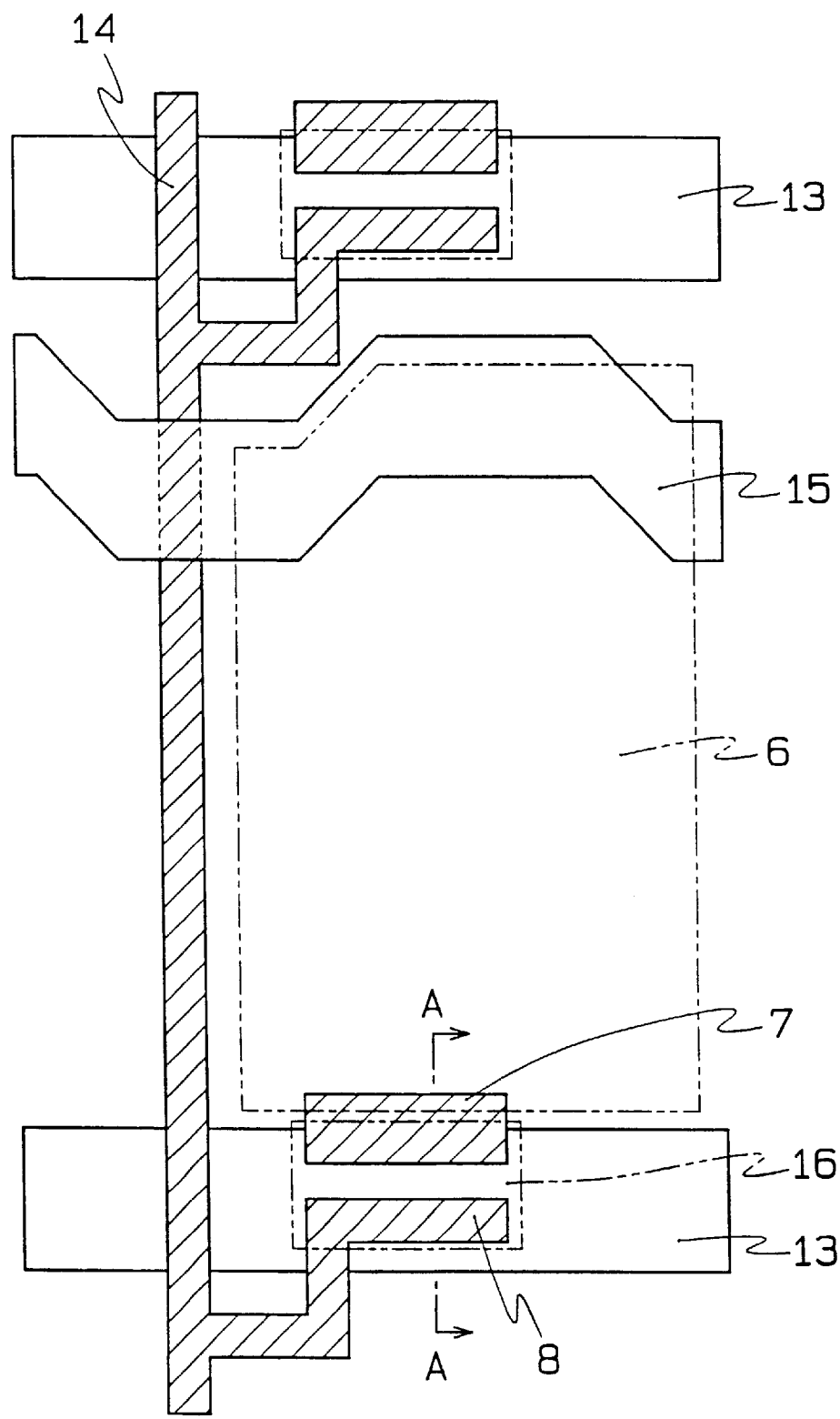
FIG. 25 is a plan, explanatory diagram showing a layout of a pixel of a TFT array in a conventional TFT-LCD.
Figure 26A:
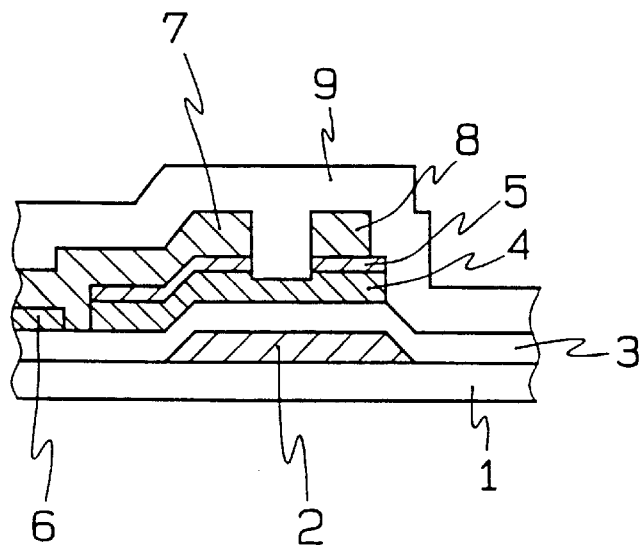
FIG. 26(a) and FIG. 26(b) are a sectional explanatory diagram showing each successive process of a manufacturing flow of a conventional TFT, FIG. 27(a) and FIG. 27(b') are a sectional explanatory diagram showing each successive process of a manufacturing flow of a conventional TFT.
Figure 26B:
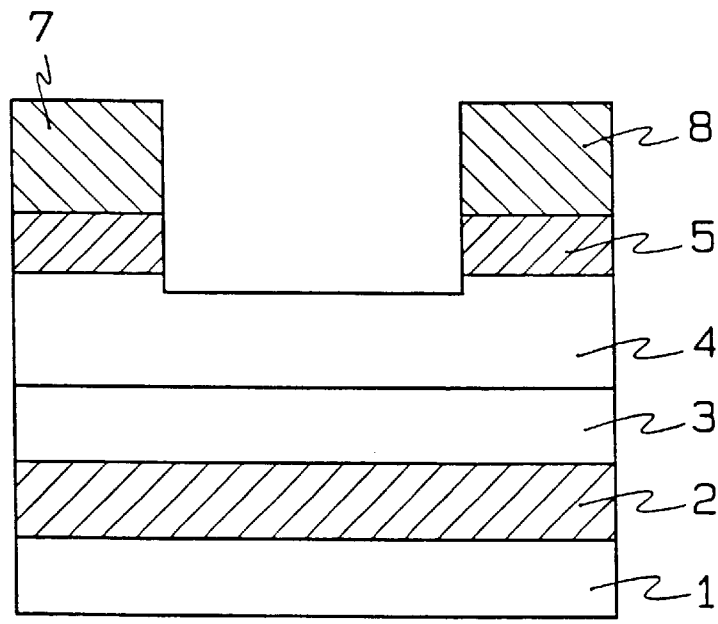
Figure 27A:
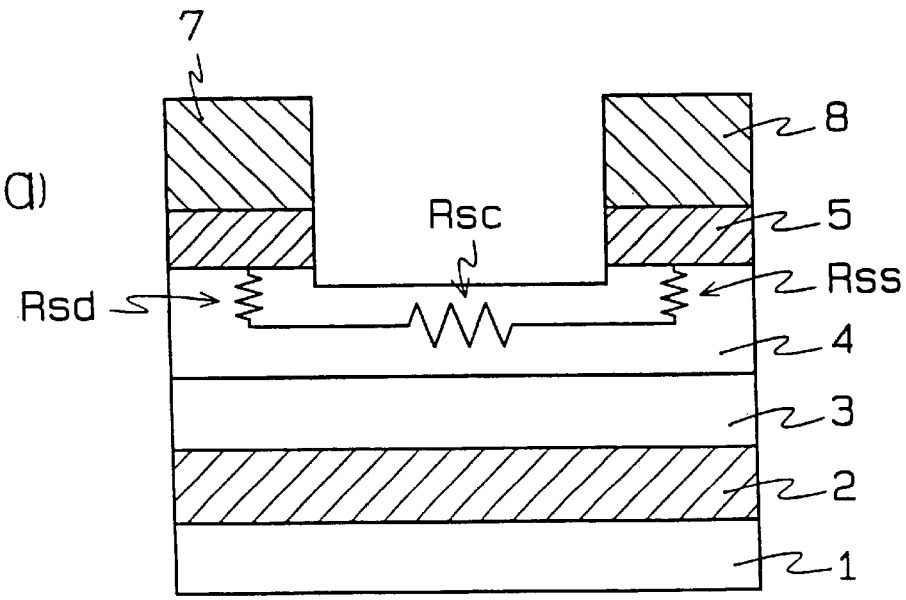
Figure 27B:
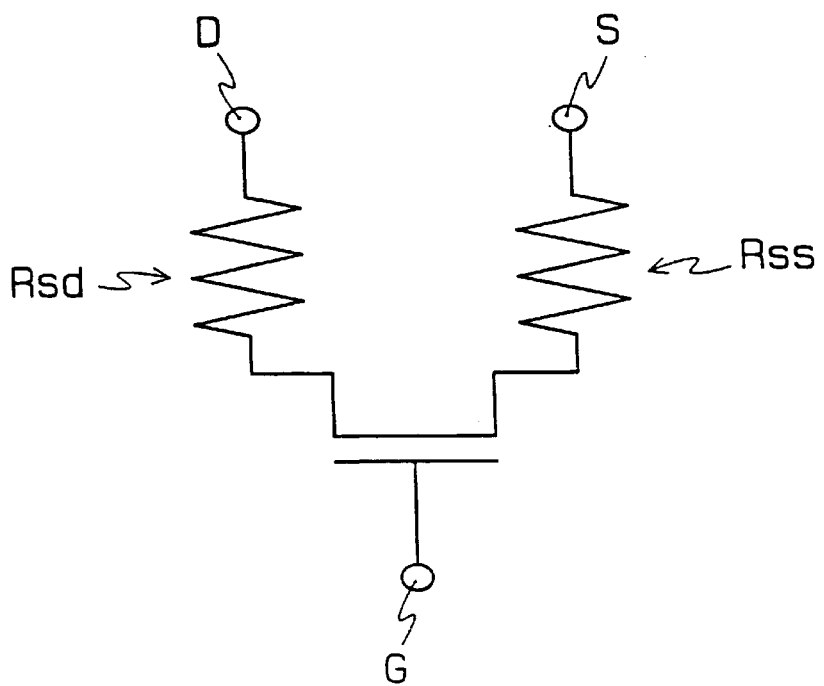
Figure 28A:
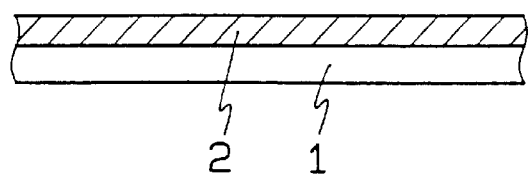
FIG. 28(a) to FIG. 28(f) are a sectional explanatory diagram showing each successive process of a manufacturing flow of a conventional TFT.
Figure 28B:
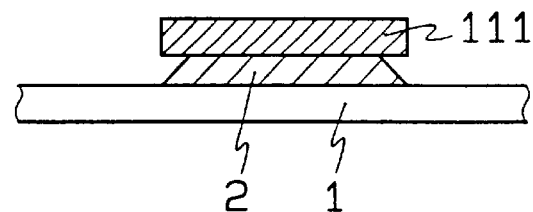
Figure 28C:
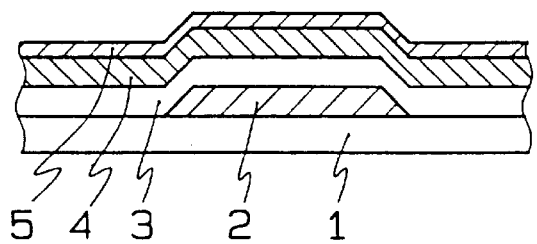
Figure 28D:
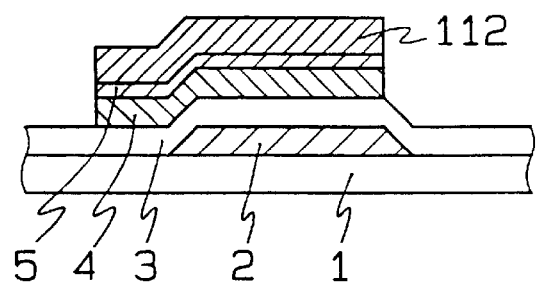
Figure 28E:
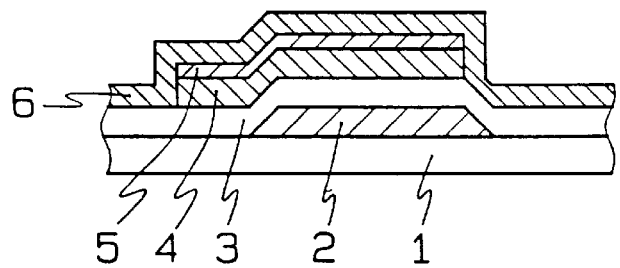
Figure 28F:
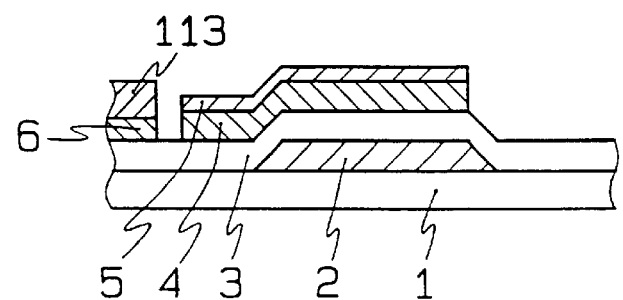
Figure 29A:
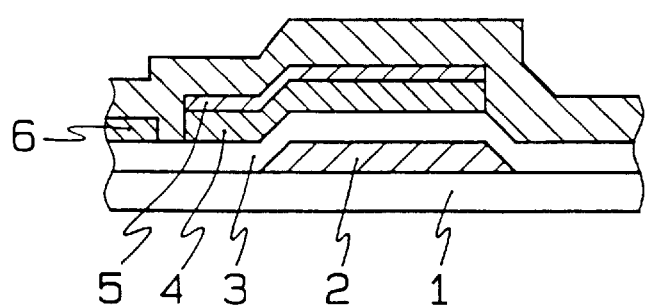
FIG. 29(a) to FIG. 29(d) are a sectional explanatory diagram showing each successive process of a manufacturing flow of a conventional TFT.
Figure 29B:
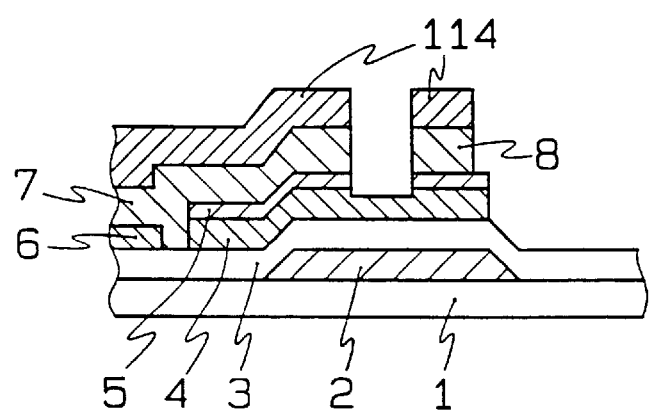
Figure 29C:
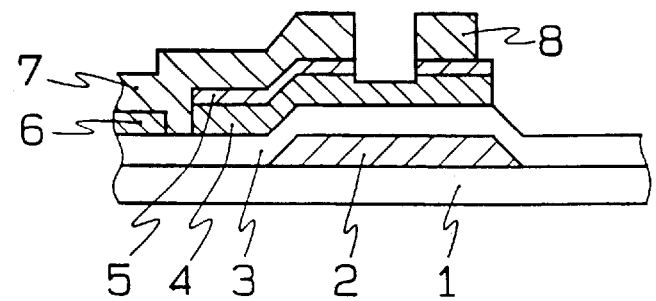
Figure 29D:
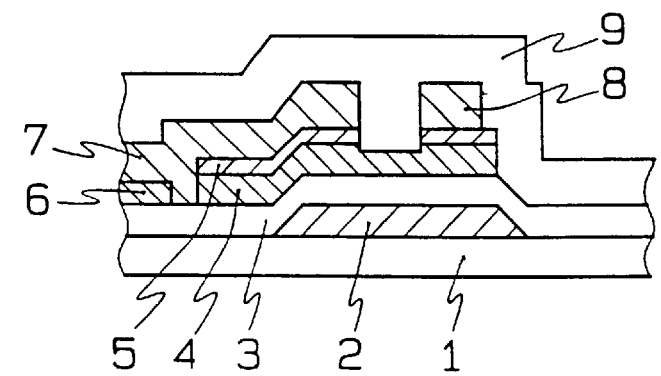

FIG. 20(a) to FIG. 20(c) show a structure of a TFT according to Embodiment 10 and a producing method thereof. FIG. 20(a) to FIG. 20(c) are a sectional, explanatory view showing each of the processes of a manufacturing method of a TFT according to Embodiment 10 of the present invention. In FIG. 20(a) to FIG. 20(c), 71 denotes a resist, and the remaining reference numerals are used in common with those of FIG. 10(a), FIG. 10(b), FIG. 11(a) and FIG. 11(b).

In the manufacturing flow as shown in FIG. 18(a) to FIG. 18(e) and FIG. 19(a) to FIG. 19(d), the area of the n-layer underlying a drain electrode and the area of the n-layer underlying a source electrode are changed to be of n-type up to a proximity of the interface without extending up to an interface of a gate insulating film 3, that is, an upper surface of the gate insulating film by adjusting the implantation energy for the ion implantation of impurities or by controlling the film thickness of the i-layer. That means that a change into n-type is performed up to a proximity of the upper surface without extending up to the upper surface of the gate insulating film. The same steps are performed as in embodiment 9 except for the step of changing to n-type up to a proximity of the interface. The steps of the manufacturing method thereafter are equal to those of Embodiment 9 as shown in FIG. 18(a) to FIG. 18(e), and FIG. 19(a) to FIG. 19(d).

As explained so far in details, it has been enabled by the thin film transistor of channel etch type according to Embodiments 1 to 4 of the present invention to achieve a decrease in serial resistance which had been a problem in prior art by thinning the film thickness of the amorphous silicon layer that is to be the channel layer and by forming an impurity layer in the source region and the drain region by ion implantation method, and by forming a gentle junction by ion implantation, generation of high electric field at the time of voltage impression is restricted to prevent an increase in OFF current, whereby an active matrix liquid crystal display of high display characteristics can be obtained.

According to the fifth embodiment of the TFT used in the TFT array substrate of the present invention, the semiconductor layer underlying the source electrode and underlying the drain electrode is arranged to be of n-layer up to the interface with the gate insulating film. Consequently, the resistance Rss at the side of the source electrode and the resistance Rsd at the side of the drain electrode are made to be extremely small so that only the resistance Rsc in the channel region remains as an ON resistance of the TFT.

Therefore, since the ON resistance of the TFT is made small and the driving performance of the TFT is improved, the TFT-LCD employing a semiconductor thin film array substrate according to Embodiment 5 is arranged in that when the number of pixels increases from XGA to SXGA and further to UXGA, the pixel electrodes of the TFT can be charged to a sufficiently high potential even if the time assigned for charging the pixel electrodes is reduced so that a high display quality can be obtained for the TFT-LCD of the present invention.

According to the fifth embodiment of TFT in the TFT array substrate of the present invention, the entire semiconductor layer underlying the source electrode and underlying the drain electrode is changed to n-layer, and the back channel portion of the TFT has a resist at the time of ion implantation so that no n-layer is formed on the channel region, and only the silicide compounds remaining in the back channel portion need to be removed after forming the source electrode and the drain electrode of metal thin film as in prior art, and removing of n-layer from the back channel portion needs not be performed as in prior art. Consequently, the film thickness of the i-layer in the channel region of the TFT is only made to substantially follow a film thickness range at the time of forming the i-layer so that control of uniformity in TFT characteristics can be easily performed and variations in display characteristics originating in the TFT can be restricted.

Since no etching of the n-layer in the back channel portion needs to be performed and no overetching has to be performed for the removal of the n-layer in the back channel as in prior art, the thickness of the i-layer in the channel region of the TFT needs not be made as thick as in prior art, and only a thin film needs to be formed from first forming the n-layer.

Further, by controlling the implantation energy at the time of ion implantation or by controlling the film thickness of the i-layer as shown in Embodiment 7, TFT characteristics similar to those of Embodiment 5 can be obtained even if a proximity of the interface remains an i-layer without changing the entire region up to the interface with the gate insulating layer into n-layer when forming a n-layer, whereby the driving performance of the TFT is improved when compared to conventional ones.

As shown in Embodiment 8, the metal thin film for forming the source electrode and the drain electrode is formed prior to removing the resist after ion implantation. At this time, when lift off including the resist is performed by utilizing the fact that only an extremely thin metal film is formed on the side surface of the resist, the channel region, the source electrode and drain electrode made of metal thin film of the TFT can be formed in a self-matching manner. Therefore, the channel length of the TFT portion is not influenced by, for instance, a shift in overlapping with the mask for forming the source electrode and drain electrode, and the TFT characteristics can be made uniform in the array substrate surface and the TFT-LCD display portion surface. Consequently, uniformity in driving characteristics and display characteristics can be improved in the TFT-LCD of the present invention.

Also in a case in which ion implantation is performed after performing steps up to the step of forming a n-layer as in the conventional manufacturing flow as shown in FIG. 9, the i-layer underlying the source electrode and underlying the drain electrode can be changed to a n-layer by a simple method of increasing the implementation energy, and thus, to decrease the resistance Rss and Rsd with substantially the same flow as a conventional manufacturing flow so that the driving performance of the TFT is improved.

The Embodiment 10 has enabled manufacturing a TFT of sufficiently high driving performance as compared to conventional ones without changing the entire semiconductor layer underlying the source electrode and the drain electrode as shown in Embodiment 9, whereby the display quality can be improved.

It should be understood that the apparatus and methods which have been shown and described herein are illustrative of the invention and are not intended to be limitative thereof. Clearly, those skilled in the art may conceive of variations or modifications to the invention. However, any such variations or modifications which falls within the purview of this description are intended to be included therein as well. The scope of the invention is limited only by the claims appended hereto.

What we claim is:

1. A method of producing TFT comprising steps of:
   (a) providing a gate electrode by forming a fist conductive film on an insulating substrate and etching the first conductive film;
   (b) forming a first insulating layer and a non-doped semiconductor layer on the gate electrode and patterning the semiconductor layer in a form of an island;
   (c) forming a junction by forming a resist layer on the semiconductor layer by photolithography and implanting an n-type impurity with the resist film being a mask, wherein a central value of the implantation range is less than a thickness of the semiconductor layer; and
   (d) providing a source electrode and gate electrode by removing the resist film, forming a second conductive film, forming an electrode pattern on the second conductive film by photolithography, and etching the second conductive film.

2. A method of producing TFT comprising steps of:
   (a) providing a gate electrode by forming a fist conductive film on an insulating substrate and etching the first conductive film;
   (b) forming a first insulating layer and a non-doped semiconductor layer on the gate electrode and patterning the semiconductor layer in a form of an island;
   (c) forming a junction by forming a resist layer on the semiconductor layer by photolithography and implanting an n-type impurity by ion implantation through rotating oblique implantation with the resist film being a mask, wherein a central value of the implantation range is less than a thickness of the semiconductor layer; and
   (d) providing a source electrode and gate electrode by removing the resist film, forming a second conductive film, forming an electrode pattern on the second conductive film by photolithography, and etching the second conductive film.

3. A method of producing TFT comprising steps of:
   (a) providing a gate electrode by forming a first conductive film on an insulating substrate and etching the first conductive film;
   (b) forming a first insulating layer and a non-doped semiconductor layer on the gate electrode;
   (c) forming a resist film on the semiconductor layer, forming a resist pattern on the resist film by exposing from a rear side of the insulating substrate and implanting an n-type impurity through ion implantation by using the resist pattern as a mask, wherein a central value of the implantation range is less than a thickness of the semiconductor layer;
   (d) removing the resist film; and
   (e) forming a source electrode and a gate electrode by forming a second conductive film, by forming an electrode pattern on the second conductive film by photolithography, and by etching the second conductive film.

4. A method of producing TFT comprising steps of:
   (a) providing a gate electrode by forming a first conductive film on an insulating substrate and etching the first conductive film;
   (b) forming a first insulating layer and a non-doped semiconductor layer on the gate electrode;
   (c) forming a resist film on the semiconductor layer, forming a resist pattern on the resist film by exposing from a back side of the insulating substrate and implanting an n-type impurity through ion implantation by rotating oblique implantation by using the resist pattern as a mask, wherein a central value of the implantation range is less than a thickness of the semiconductor layer;
   (d) removing the resist film; and
   (e) forming a source electrode and a gate electrode by forming a second conductive film, by forming an electrode pattern on the second conductive film by photolithography and by etching the second conductive film.

5. A method of producing a semiconductor TFT comprising steps of:

(1) forming a gate line by forming a first metal thin film on an insulating substrate and subjecting to patterning it thereafter, (2) forming a gate insulating film so as to cover the gate line, (3) forming an intrinsic semiconductor layer by forming an intrinsic semiconductor thin film on the gate insulating film and patterning a source region, a drain region as well as a channel region of the intrinsic semiconductor thin film thereafter, (4) forming a resist on the channel region of the intrinsic semiconductor layer, ion implanting impurities onto the intrinsic semiconductor layer to change both, the source region and the drain region of the intrinsic semiconductor layer, to an n-layer and the channel region of the intrinsic semiconductor layer to an i-layer, and further removing the resist, wherein a central value of the implantation range is less than a thickness of the semiconductor layer, (5) forming a transparent conductive film by covering the intrinsic semiconductor layer, and patterning a pixel region of the transparent conductive film to obtain a pixel electrode and removing the transparent conductive film of portions other than for the pixel electrode, and (6) respectively forming a source electrode and a drain electrode by forming a second metal thin film by covering the intrinsic semiconductor layer, and patterning a source region and a drain region of the second metal thin film.

6. A method of producing a semiconductor TFT comprising steps of:

(1) forming a gate line by forming a first metal thin film on an insulating substrate and subjecting to patterning thereafter, (2) forming a gate insulating film so as to cover the gate line, (3) forming an intrinsic semiconductor thin film on the gate insulating film, forming a resist on a channel region of the intrinsic semiconductor thin film, and implanting impurities on regions other than the channel region of the intrinsic semiconductor thin film to change all regions except for the channel region into an n-type semiconductor thin film, wherein a central value of the implantation range is less than a thickness of the semiconductor layer, (4) patterning the source region and the drain region of the n-type semiconductor thin film and the channel region of the intrinsic semiconductor thin film to be a semiconductor region portion, and making the source region and the drain region of the n-type semiconductor thin film an n-layer and the channel region of the intrinsic semiconductor thin film an i-layer by removing the n-type semiconductor thin film from portions other than the semiconductor region portion, (5) forming a transparent conductive film by covering the semiconductor region of the n-type semiconductor thin film, patterning a pixel region of the transparent conductive film to obtain a pixel electrode, and removing the transparent conductive film of portions other than for the pixel electrode, and (6) respectively forming a source electrode and a drain electrode by forming a second metal thin film by covering the semiconductor region, and patterning a source region and a drain region of the second metal thin film.

7. A method of producing a semiconductor TFT comprising steps of:

(1) forming a gate line by forming a first metal thin film on an insulating substrate and subjecting to patterning it thereafter, (2) forming a gate insulating film so as to cover the gate line, (3) forming an intrinsic semiconductor thin film on the gate insulating film, patterning a source region, a drain region as well as a channel region of the intrinsic semiconductor thin film to be a semiconductor region portion, and obtaining an intrinsic semiconductor layer by removing portions of the intrinsic semiconductor thin film other than the semiconductor region portion, (4) forming an n-type semiconductor thin film on the intrinsic semiconductor film, forming a resist on the channel region of the n-type semiconductor thin film, implanting impurities into the intrinsic semiconductor layer through the n-type semiconductor thin film, and removing the resist to change the source region and the drain region of the intrinsic semiconductor layer into an n-layer and the channel region of the intrinsic semiconductor layer into an i-layer, wherein a central value of the implantation range is less than a thickness of the semiconductor layer, (5) forming a transparent conductive film by covering the n-type semiconductor thin film, patterning a pixel region of the transparent conductive film to obtain a pixel electrode and removing the transparent conductive film of portions other than for the pixel electrode, and (6) respectively forming a source electrode and a drain electrode by forming a second metal thin film by covering the n-type semiconductor thin film, and patterning a source region and a drain region of the second metal thin film.

* * * * *